United States Patent [19]

Yamamura et al.

[11] Patent Number: 5,079,606
[45] Date of Patent: Jan. 7, 1992

[54] THIN-FILM MEMORY ELEMENT

[75] Inventors: Nobuyuki Yamamura, Hanno; Shinichi Shimomaki, Tokyo; Hideaki Shimizu, Inagi; Hiroshi Matsumoto, Tachikawa; Naoki Kato, Fussa, all of Japan

[73] Assignee: Casio Computer Co., Ltd., Tokyo, Japan

[21] Appl. No.: 467,736

[22] Filed: Jan. 19, 1990

[30] Foreign Application Priority Data

| Jan. 26, 1989 | [JP] | Japan | 1-15165 |
| Mar. 31, 1989 | [JP] | Japan | 1-78388 |
| Apr. 25, 1989 | [JP] | Japan | 1-103531 |
| May 12, 1989 | [JP] | Japan | 1-117579 |
| Jul. 19, 1989 | [JP] | Japan | 1-184818 |

[51] Int. Cl.$^5$ ............................... H01L 29/78
[52] U.S. Cl. ............................... 357/23.7; 357/2; 357/4; 357/23.5
[58] Field of Search ............... 357/23.7, 2, 23.5, 4

[56] References Cited

U.S. PATENT DOCUMENTS

| 4,089,022 | 5/1978 | Asai et al. | 357/23.7 |
| 4,110,839 | 8/1978 | Bert et al. | 357/23.7 |
| 4,250,569 | 2/1981 | Sasaki et al. | 357/23.7 |
| 4,323,910 | 4/1982 | Sokoloski et al. | 357/23.7 |
| 4,353,083 | 10/1982 | Trudel et al. | |
| 4,358,748 | 11/1982 | Gruner et al. | |
| 4,377,819 | 3/1983 | Sakai et al. | 357/23.7 |
| 4,481,527 | 11/1984 | Chen et al. | |
| 4,527,181 | 7/1985 | Sasaki | 357/23.7 |
| 4,667,217 | 5/1987 | Janning | 357/23.5 |
| 4,668,968 | 5/1987 | Ovshinsky et al. | 357/23.7 |
| 4,686,558 | 8/1987 | Adam | |
| 4,804,637 | 2/1989 | Smayling et al. | |
| 4,821,092 | 4/1989 | Noguchi | |
| 4,831,427 | 5/1989 | Coleman, Jr. | 357/23.5 |
| 4,876,582 | 10/1989 | Janning | 357/23.7 |
| 4,968,638 | 11/1990 | Wright et al. | 357/23.7 |

FOREIGN PATENT DOCUMENTS

| 0312955 | 10/1988 | European Pat. Off. | |
| 0299185 | 1/1989 | European Pat. Off. | 357/23.7 |
| 0016251 | 11/1979 | Fed. Rep. of Germany | |
| 57-90977 | 6/1982 | Japan | 357/23.7 |
| 57-204168 | 12/1982 | Japan | 357/23.7 |
| 58-58773 | 4/1983 | Japan | 357/23.7 |
| 58-115850 | 7/1983 | Japan | 357/23.7 |

OTHER PUBLICATIONS

IEEE Transactions on Electron Devices, vol. ED-14, No. 12, Dec. 1967, "An Adaptive Thin Film Transistor", by Perlman; pp. 816-819.

IEEE Transactions on Electron Devices, vol. ED-21, No. 8, Aug. 1974, "A New Ferroelectric Memory Device, Metal-Ferroelectric-Semiconductor Transistor" by Wu, pp. 499-504.

Primary Examiner—Rolf Hille
Assistant Examiner—Steven Loke
Attorney, Agent, or Firm—Frishauf, Holtz, Goodman & Woodward

[57] ABSTRACT

A thin-film memory element made by the technique of forming thin film and functioning as a thin-film transistor. The memory element has two gate-insulating films, and two gate electrodes formed on the gate-insulating films, respectively. The first gate-insulating film can accumulate electrical charge, whereas the second gate-insulating film cannot. The gate electrode on the first gate-insulating film is used as write/erase electrode, and the gate electrode on the second gate-insulating film is used as read electrode. Since the memory element has two electrodes, one for writing or erasing data, and the other for reading data, its threshold voltage remains unchanged. Hence, data can be read from the thin-film memory element for a virtually indefinitely long period of time.

7 Claims, 15 Drawing Sheets

THIN-FILM MEMORY ELEMENT

BACKGROUND OF THE INVENTION

1. Field of the Invention

The present invention relates to a thin-film memory element and, also, a method of manufacturing the same.

2. Description of the Related Art

A thin-film memory element comprising a thin-film transistors is disclosed in U.S. patent applications Ser. Nos. 427,041 and 427,252 and EPC Patent Applications Nos. 89/20014.9 and 89/120022.2. Data can be electrically written into, read from, and erased from, this thin-film memory element.

FIG. 1 attached hereto is a sectional view illustrating the thin-film memory element described in the patent application identified above. The element comprises a thin-film transistor of the so-called inverted staggered type. As is shown in FIG. 1, the thin-film transistor is formed on an insulating substrate 11 made of glass or the like. This transistor, which can store data, comprises a gate electrode G formed on the substrate 11, a gate-insulating film 12 formed on the entire surface of the substrate 11, covering the gate electrode G, a semiconductor layer 13 made of i(intrinsic)-type a-Si (amorphous silicon) formed on the gate-insulating film 12 and opposing the gate electrode G, an n+-type a-Si layer 14 formed on the semiconductor layer 13, a source electrode S formed on the n+-type a-Si layer 14, and a drain electrode D also formed on the n+-type a-Si layer 14. The source electrode S and the drain electrode D are connected to two leads (not shown), respectively. The gate-insulating film 12 is made of, for example, SiN. The ratio of silicon atoms to nitrogen atoms, i.e., Si/N, of the film 12 ranges from 0.85 to 1.1. The film 12 can accumulate electrical charge. This is why the thin-film transistor can stored data.

The thin-film memory element shown in FIG. 1 has hysteresis in terms of its $V_G$-$I_D$ characteristic, where $V_G$ is the gate voltage, and $I_D$ is the drain current flowing in the source-drain path. Due to the hysteresis of the $V_G$-$I_D$ characteristic, data can be electrically written into, read from, and erased from the thin-film memory element.

FIG. 3 is a graph representing the $V_G$-$I_D$ characteristic of the thin-film memory element, which has been determined by the use of the measuring circuit illustrated in FIG. 2. As FIG. 3 clearly shows, the $V_G$-$I_D$ characteristic of the tin-film memory element described above exhibits hysteresis.

The voltage $\Delta V_{th}$ (hereinafter referred to as "threshold voltage") which the thin-film memory element had when a drain current $I_D$ of 1 nA flowed through the thin-film memory element is measured. The threshold voltage $\Delta V_{th}$-n was $-15$ V when a voltage of $-30$ V was applied of the gate electrode G as is illustrated in FIG. 4A. When a voltage $V_G$ of 0 V was applied to the gate G thereafter, a drain current $I_D$ was still flowing via the thin-film memory element Obviously, the thin-film memory element exhibited the characteristic of a depletion-type transistor, which is represented by curve A shown in FIG. 3. On the other hand, the threshold voltage $\Delta V_{th}$-p was $+12$ V when a voltage of $+30$ V was applied of the gate electrode G as is shown in FIG. 4B. In this case, no drain currents $I_D$ flowed in the thin-film memory element unless the gate voltage $V_G$ was higher than 0 V. In other words, the thin-film memory element exhibited the characteristic of an enhancement-type transistor, which is represented by curve B shown in FIG. 3.

Therefore, it suffices to control the voltage applied to the gate electrode G in order to operate the thin-film memory element. More precisely, to erase data from the thin-film memory element, a voltage of $-30$ V and a voltage of $+10$ V to the gate electrode G and the drain electrode D, and the source electrode S is grounded respectively, as is illustrated in FIG. 4A, whereby the thin-film memory element exhibits the characteristic of a depletion-type transistor. To write data into the thin-film memory element, a voltage of $+30$ V and a voltage of $+10$ V to the gate electrode G and the drain electrode D, respectively, and the source electrode S is connected to the ground, as is illustrated in FIG. 4B, whereby the thin-film memory element exhibits the characteristic of an enhancement-type transistor. In order to read data from the thin-film memory element, a voltage of $+10$ V is applied to the drain electrode D, the source electrode S is grounded, and a selection voltage of 0 V and non-selection voltage of $-20$ V are applied to the gate electrode G, as is illustrated in FIG. 4C.

The threshold voltages $\Delta V_{th}$-n and $\Delta V_{th}$-p of the conventional thin-film memory element change in the way shown in FIG. 5 as the data is repeatedly read from the memory element. This is because the same voltage is applied to the gate electrode G, not only to write data into the element but also to erase data therefrom. Consequently, it may no longer be possible to read data reliably from the thin-film memory element when data-reading has been repeated a certain number of times.

SUMMARY OF THE INVENTION

Accordingly, it is an object to provide a thin-film memory element whose threshold voltage does not noticeably change no matter how many times data is repeatedly read from it, and which can therefore be used to read data reliably for an indefinitely long period of time.

It is another object of the invention to provide a method of manufacturing a thin-film memory element of the type described above.

According to an aspect of the invention, there is provided a thin-film memory element which comprises: a semiconductor layer having first and second major surfaces; a source electrode and a drain electrode, both electrically connected to the semiconductor layer; a first gate-insulating film formed on the first major surface of the semiconductor layer and capable of accumulating an electrical charge; a second gate-insulating film formed on the second major surface of the semiconductor layer and not capable of accumulating an electrical charge; a first gate electrode formed on the first gate-insulating film; and a second gate electrode formed on the second gate-insulating film.

A gate voltage is applied to the first gate electrode in order to write data into, and erase data from, the thin-film memory element. A voltage is applied to the second gate electrode in order to read data from the thin-film memory element. Since one electrode is used to write data into, and erase data from, the thin-film memory element, and another electrode to read data from the memory element, the threshold voltage of the thin-film memory element remains virtually unchanged no matter how many times data is repeatedly read from the thin-film memory element. Therefore, the thin-film memory element can be used for an indefinitely long time.

According to another aspect of the invention, there is provided a method of manufacturing a thin-film memory element, the method comprising the steps of: forming a first gate electrode on an insulating substrate; forming a first gate-insulating film able to accumulate electrical charge, on the first gate electrode and the substrate; forming a semiconductor layer on the first gate-insulating film; forming a source electrode and a drain electrode on the semiconductor layer, either set apart from the other for a predetermined distance; forming a second gate-insulating film unable to accumulate electrical charge, on the semiconductor layer, the source and drain electrodes; and forming a second gate electrode on the second gate-insulating film.

The thin-film memory element manufactured by this method has two gate electrode. One gate electrode is used to write data and erase data, whereas the other gate electrode is used to read data. The threshold voltage of the thin-film memory element therefore remains virtually unchanged now matter how many times data is read from the thin-film memory element. Hence, the thin-film memory element can be used for an indefinitely long time.

DETAILED DESCRIPTION OF THE PREFERRED EMBODIMENTS

Figure 6:
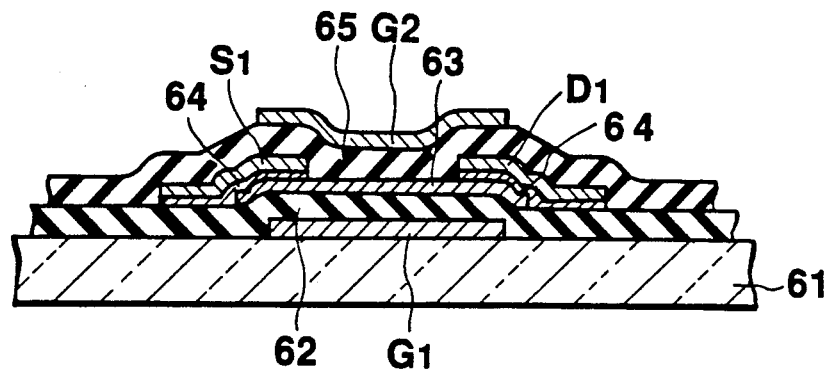
FIG. 6 and FIG. 7 are a sectional view and a plan view, respectively, showing a thin-film memory element according to a first embodiment of the present invention.
Figure 7:
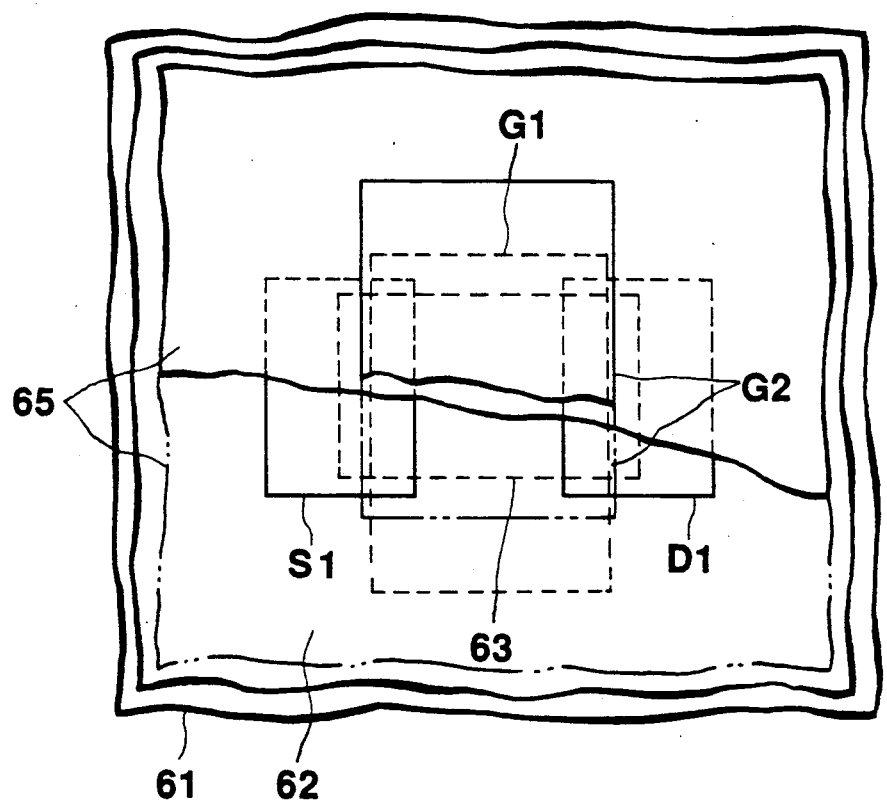

The thin-film memory element according to the first embodiment of the invention will now be described with reference to FIGS. 6 and 7 which are a sectional view and a plan view of the memory element, respectively. As is illustrated in FIGS. 6 and 7, the thin-film memory element comprises an insulating substrate 61 made of glass or the like. A first gate electrode G1 is formed on the substrate 61. A first gate-insulating film 62 is formed on the substantially entire upper surface of the substrate 61, thus covering up the first gate electrode G1. The first gate-insulating film 62 is made of SiN whose Si/N composition ratio ranges from 0.85 to 1.1, and which can therefore accumulate electrical charge. An i-type a-Si (intrinsic-type, amorphous silicon) semiconductor layer 63 is formed on the first gate-insulating film 62 and located above the first gate electrode G1. N+-type a-Si layers 64 are formed on the semiconductor layer 63. A source electrode S1 and a drain electrode D1 are formed on the n+-type a-Si layers 64 and are located above the semiconductor layer 63. The source electrode S1, the drain electrode D1, the semiconductor layer 63, the gate-insulating film 62 capable of accumulating electrical charge, and the first gate electrode G1 constitute a thin-film transistor of the inverted staggered type.

The thin-film memory element also comprises a second gate-insulating film 65 on the upper surface of the structure, thereby covering up the semiconductor layer 63 and the source and drain electrodes S1 and D1 both connected to the layer 63. A second gate electrode G2 is formed on the second gate-insulating film 65 and located above the semiconductor layer 63. The second gate-insulating film 65 is made of SiN whose Si/N composition ratio is equal to stoichiometric ratio or similar thereto, and is not capable of accumulating electrical charge. The first gate electrode G1, the source electrode S1, the drain electrode D1, and the second gate electrode G2 are connected to leads (not shown), respectively.

It should be noted that the expression "not capable of accumulating electrical charge" used throughout the specification means that the gate-insulating film cannot accumulate electrical charge large enough to store data.

The first gate electrode G1, which is formed on the first gate-insulating film 62 capable of accumulating electrical charge and located below the semiconductor layer 63, is used as write/erase electrode, whereas the second gate electrode G2, which is formed on the second gate-insulating film 65 incapable of accumulating electrical charge and located above the semiconductor layer 63, is used as read electrode.

In summary, the thin-film memory element comprises the first gate electrode G1, the first gate-insulating film 62 capable of accumulating electrical charge, the semiconductor layer 63, the source electrode S1, the drain electrode D1, the second gate-insulating film 65, and the second gate electrode G2 formed on the film 65 and located above the semiconductor layer 63. The first gate electrode G1, first gate-insulating film 62, the semiconductor layer 63, the source electrode S1, and the drain electrode D1 constitute a thin-film transistor. The first gate electrode G1 is used to write and erase data, whereas the second gate electrode G2 is used to read data.

With reference to FIGS. 8A to 8D, it will be explained how the thin-film memory element described above is manufactured.

Figure 8A:
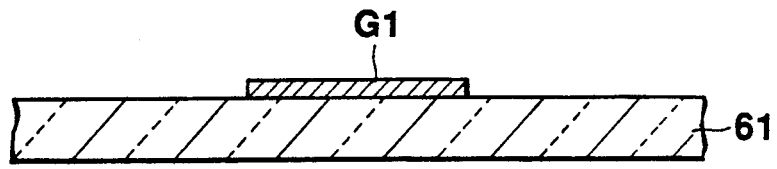
FIGS. 8A to 8D are sectional views of an unfinished product, explaining the steps of manufacturing the thin-film memory element shown in FIGS. 6 and 7.

First, as is shown in FIG. 8A, the first gate electrode G1 is formed on the insulating substrate 61 More specifically, a chromium film is formed on the substrate 61 by means of vacuum vapor deposition, and is then patterned by means of photolithography.

Figure 8B:
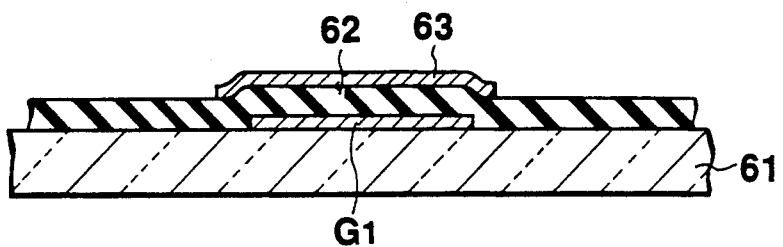

Next, as is illustrated in FIG. 8B, the first gate-insulting film 62 made of SiN whose Si/N ratio ranges from 0.85 to 1.1 and which can accumulate electrical charge is formed on the substrate 61 and also the first gate electrode G1. Then, the i-type a-Si semiconductor layer 63 is formed on the first ate-insulating film 62. More precisely, the first gate-insulating film 62 of i-type a-SiN is formed by plasma CVD method, wherein a mixture gas of silane, ammonia, and nitrogen is applied, silane, ammonia, and nitrogen gases being fed at such flow rates that SiN whose Si/N ratio is 0.85 to 1.1 is deposited on the substrate 61. The semiconductor layer 64 is formed also by plasma CVD method, wherein a mixture gas of silane and hydrogen is applied, thus forming an i-type a-Si film on the first gate-insulating film 62, and then is patterned by means of photolithography.

Figure 8C:
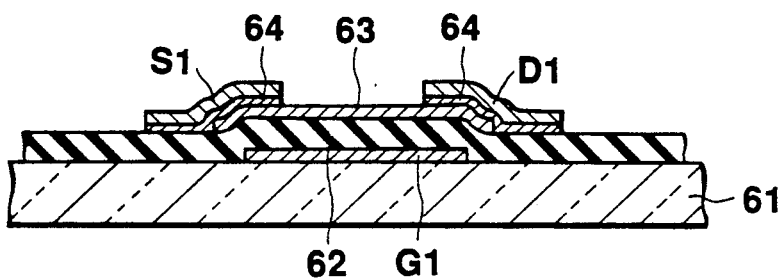

Then, as is shown in FIG. 8C, the n+-type a-Si layers 64 are formed on the i-type a-Si semiconductor layer 63 and also on the first gate-insulating film 62. The layers 64 contain phosphorus and have therefore a high electron concentration. Further, the source electrode S1 and the drain electrode D1 are formed on the n+-type a-Si layers 64. The layers 64 form good ohmic contacts between the semiconductor layer 63, on the one hand, and the source and drain electrodes S1 and D1, on the other hand. More specifically, the n+-type a-Si layers 64, the source electrode S1, and the drain electrode D1 are formed in the following process. First, an n+-type a-Si film is formed on the semiconductor layer 63 by means of plasma CVD method, in which a mixture gas of silane, phosphite, and hydrogen is applied. Next, a chromium film is formed on the n+-type a-Si layer 64. Finally, the n+-type a-Si film and the chromium film, thus formed, are patterned by means of photolithography.

Figure 8D:
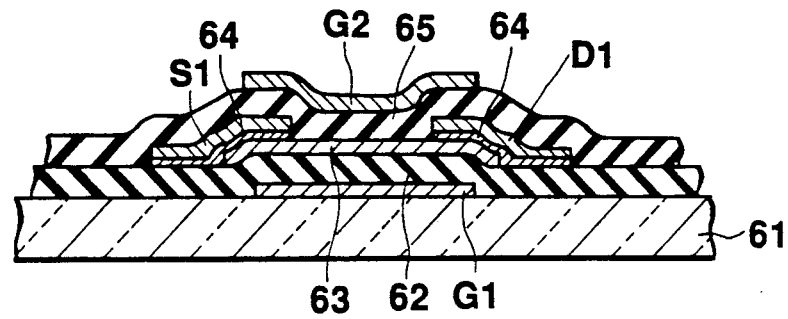

Thereafter, as is illustrated in FIG. 8D, the second gate-insulating film 65 made of SiN, which cannot accumulate electrical charge, is formed on the substantially entire surface of the first gate electrode 62, thus covering up the i-type semiconductor layer 63, the source electrode S1, and the drain electrode D1. Further, the second gate electrode G2 is formed on the second gate-insulating film 65, at a position right above the i-type a-Si semiconductor layer 63. To be more precise, the second gate-insulating film 65 of SiN is formed by means of plasma CVD method, wherein a mixture gas of silane, ammonia, and nitrogen is applied, the silane, ammonia and nitrogen gases being fed at such flow rates that SiN whose Si/N ratio is 0.75 is deposited on the i-type semiconductor layer 63, the source electrode S1, and the drain electrode D1. The second gate electrode G2 is formed first by vacuum-depositing a chromium film on the second gate electrode 65 and then by patterning the chromium film by means of photolithography.

Thus, the thin-film memory element shown in FIGS. 6 and 7 is manufactured, by carrying out the steps explained with reference to FIGS. 8A to 8D. The operation of the thin-film memory element will now be explained, with reference to FIGS. 9A to 9C and FIG. 10.

Figure 1:
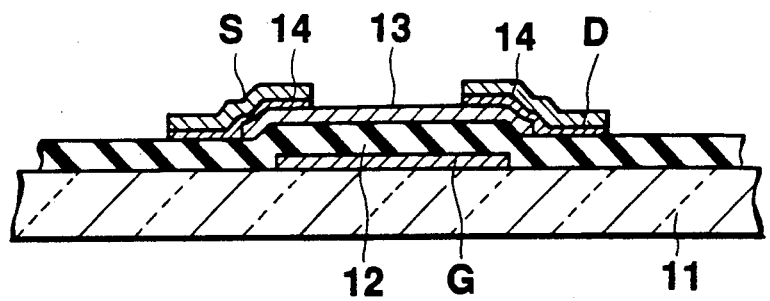
FIG. 1 is a sectional view showing a conventional thin-film memory element.
Figure 2:
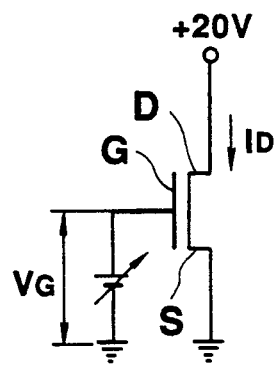
FIG. 2 is a diagram illustrating a circuit for determining the $V_G$-$I_D$ characteristic of the conventional thin-film memory element shown in FIG. 1.
Figure 3:
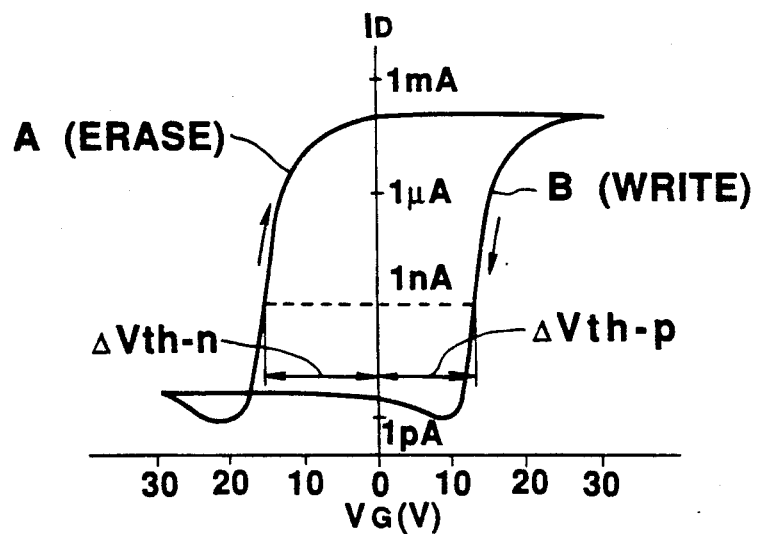
FIG. 3 is a graph representing the $V_G$-$I_D$ characteristic of the conventional thin-film memory element.
Figures 4A, 4B, 4C:
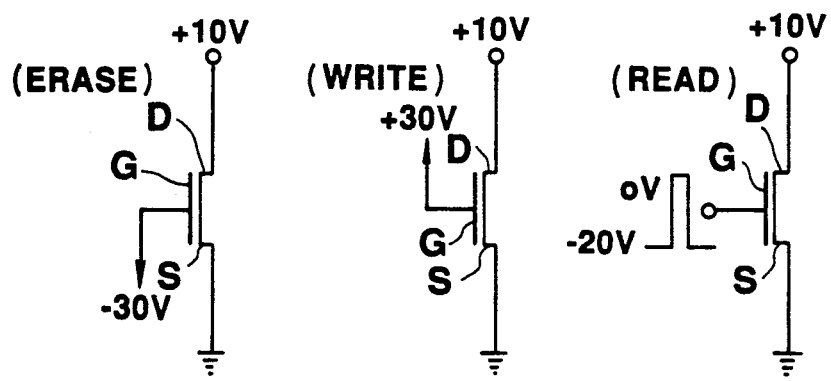
FIGS. 4A to 4C are circuit diagrams explaining how the conventional thin-film memory element is driven to erase data, write data, and read data.
Figure 5:
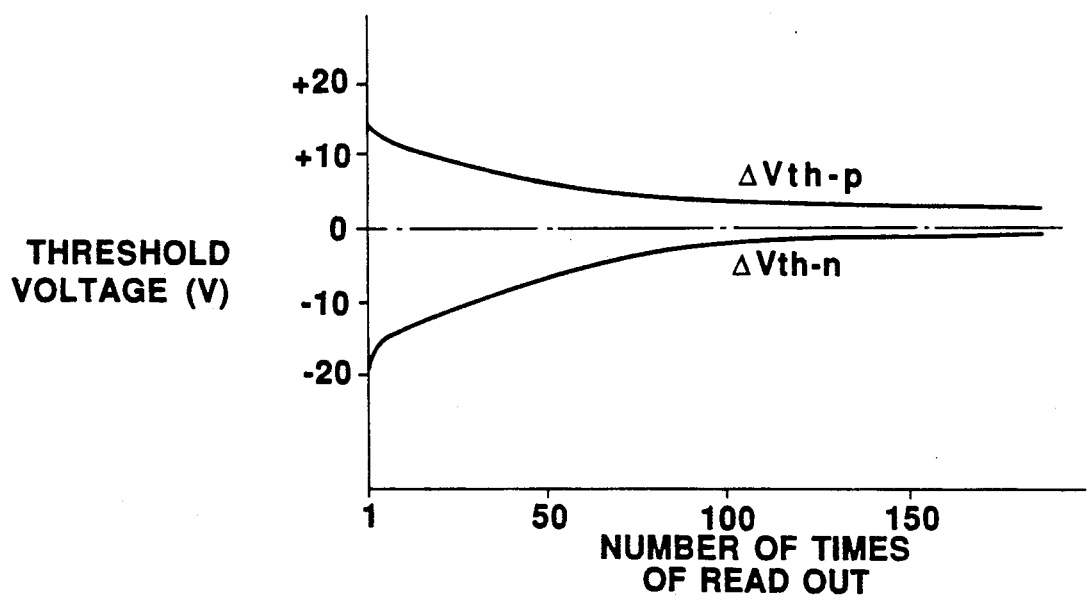
FIG. 5 is a graph showing how the threshold voltage of the conventional memory element changes as it repeatedly performs the data-reading operation.
Figure 9A:
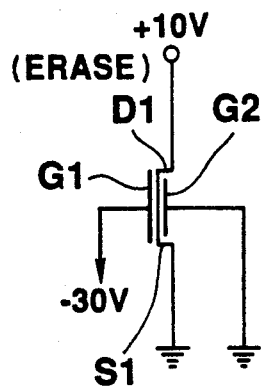
FIGS. 9A to 9C are circuit diagrams explaining how the thin-film memory element shown in FIGS. 6 and 7 is driven to erase data, write data, and read data.

In order to erase data from the thin-film memory element, the voltages of $-30$ V and $+10$ V are applied to the first gate electrode G1 (hereinafter called "write/erase gate electrode") and the drain electrode D1, respectively, and the source electrode S1 and the second gate electrode G2 (hereinafter called "read gate electrode") are connected to the ground, as is shown in FIG. 9A. In this case, the thin-film memory element exhibits the $V_G'$-$I_D$ characteristic of a depletion-type transistor. Thus, a drain current $I_D$ flows even if the gate voltage $V_G$ applied to the write/erase gate electrode G1 is 0 V, as is understood from the curve A shown in FIG. 3.

Figure 9B:
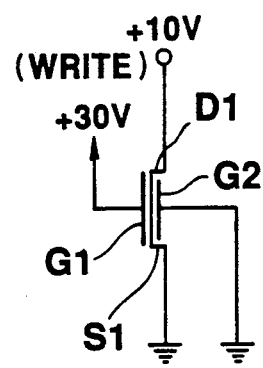

To write data into the thin-film memory element, the voltages of $+30$ V and $+10$ V are applied to the write/erase gate electrode G1 and the drain electrode D1, respectively, and the source electrode S1 and the read gate electrode G2 are connected to the ground, as is illustrated in FIG. 9B. In this case, the memory element exhibits the $V_G'$-$I_D$ characteristic of an enhancement-type transistor. Therefore, no drain currents $I_D$ flow if the gate voltage $V_G$ applied to the write/erase gate electrode G1 is 0 V or more.

To read data from the thin-film memory element, the voltages of $+10$ V is applied to the drain electrode D1, the source electrode S1 and the write/erase gate electrode G1 are connected to the ground, and a pulse signal which is at high level of 0 V to select the memory element and at low level of $-20$ V not to select the memory element is supplied to the read gate electrode G2. When the voltage of $-20$ V (i.e., the non-selection voltage) is applied to the read gate electrode G2, the thin-film memory element exhibits the $V_G'$-$I_D$ characteristic of a depletion-type transistor. Hence, the drain current $I_D$ changes with the gate voltage $V_G'$ applied to the gate electrode G2 as is indicated by the curve A' shown in FIG. 10. On the other hand, when the voltage of 0 V (i.e., the selection voltage) is applied to the read gate electrode G2, the thin-film memory element exhibits the $V_G'$-$I_D$ characteristic of an enhancement-type transistor. The drain current $I_D$ therefore changes with the gate voltage $V_G'$ as is indicated by the curve B' shown in FIG. 10.

As can be understood from the above, the thin-film memory element exhibits either the characteristic of a depletion-type transistor or that of an enhancement-type transistor, not only in accordance with the voltage applied to the write/erase gate electrode G1, but also in accordance with the voltage applied to the read gate electrode G2.

Figure 9C:
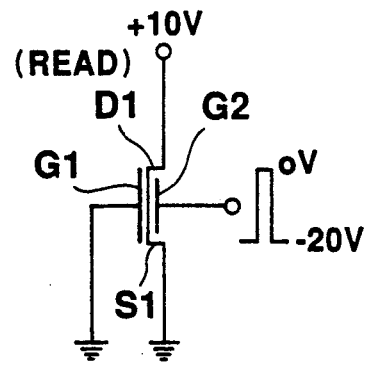
Figure 10:
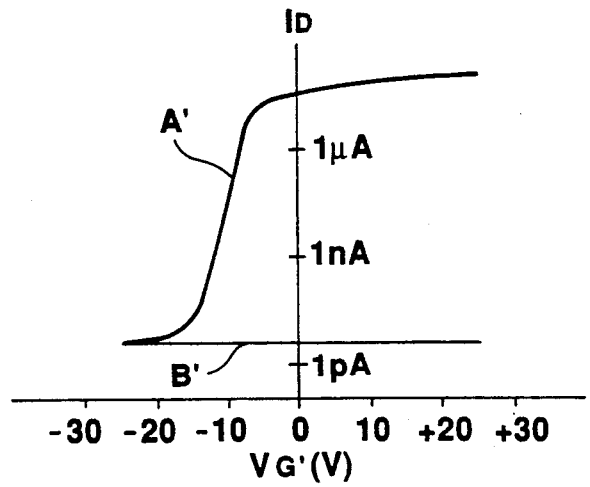
FIG. 10 is a graph representing the $V_G'$-$I_D$ characteristic the memory element shown in FIGS. 6 and 7 exhibits when a gate voltage is applied to the gate electrode of the element to read data from the memory element.
Figure 11:
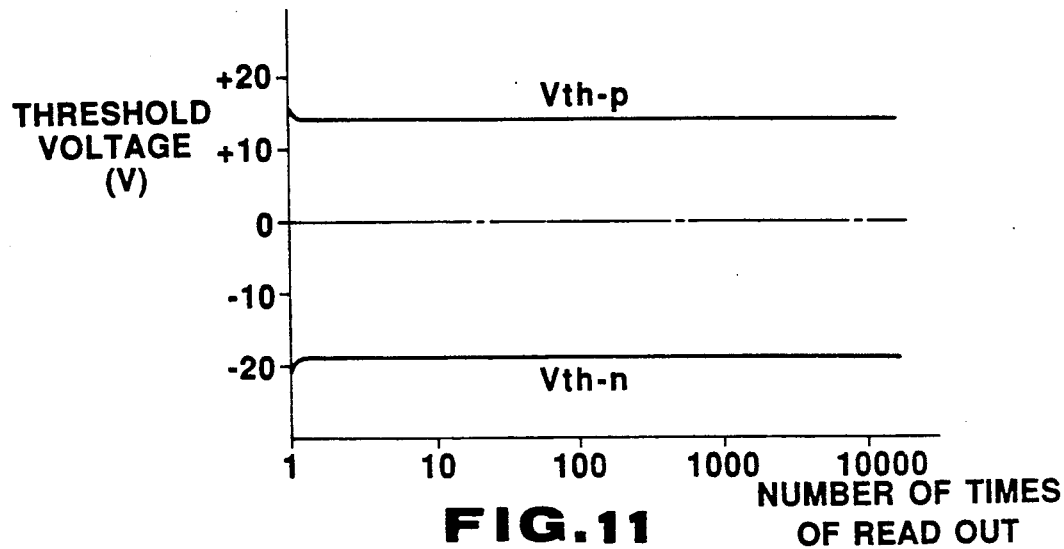
FIG. 11 is also a graph explaining how the threshold voltage of the memory element shown in FIGS. 6 and 7 changes as it repeatedly performs the data-reading operation.

A thin-film memory elements identical to the memory element shown in FIGS. 6 and 7 was made. A voltage of +10 V was applied to the drain electrode D1, both the source electrode S1 and the write/erase gate electrode G1 were grounded, and a pulse signal which is alternately at high level of 0 V (the selection voltage) low level of −20 V (the non-selection voltage) is supplied to the read gate electrode G2, as is illustrated in FIG. 9C, thereby to read data from the thin-film memory element repeatedly. As is evident from FIG. 11, neither the threshold voltage ΔVth-n nor the threshold voltage ΔVth-p changed noticeably after data had been read from the memory element many times.

As has been described above, the thin-film memory element comprises the first gate electrode G1 (i.e., the write/erase gate electrode), the first gate-insulating film 62 capable of accumulating electrical charge, the semiconductor layer 63, the source electrode S1, the drain electrode D1, the second gate-insulting film 65, and the second gate electrode G2 (i.e., the read gate electrode) formed on the film 65 and located above the semiconductor layer 63. The first gate electrode G1, first gate-insulating film 62, the semiconductor layer 63, the source electrode S1, and the drain electrode D1 constitute a thin-film transistor. The first gate electrode G1 is used to write and erase data, whereas the second gate electrode G2 is used to read data. Neither the threshold voltage ΔVth-n nor the threshold voltage ΔVth-p of the thin-film memory element changes noticeably no matter how many times data has been read from the memory element. Therefore, data can reliably read out of the memory element for a substantially indefinitely long period of time.

In the above embodiment, the first gate-insulating film 62, which can accumulate electrical charge, is made of SiN whose Si/N ratio ranges from 0.85 to 1.1. The first gate-insulating film 62 can be replaced by a double-layered insulating film comprised of a dielectric film and a thin SiN film formed on the dielectric film. The SiN film has a thickness of 100 to 1,000 Å and is made of SiN whose Si/N ratio is equal or similar to stoichiometric ratio. The dielectric film is made of metal oxide such as tantalum oxide, titanium oxide, or titanium zinc zirconate and the double-layered insulating film can accumulate electrical charge. Further, the second gate-insulating film 65, unable to accumulate electrical charge is not limited to a SiN film; it can be made of $SiO_2$ or the like.

Moreover, the first gate-insulating film 62 is replaced by an insulating film which cannot accumulate electrical charge, and the second gate-insulating film 65 is replaced by an insulating film which can accumulate electrical charge, just other way around. In this case, the second gate electrode G2, which is formed on the second gate-insulating film 65 and located right above the semiconductor layer 63, is used as write/erase gate electrode, whereas the first gate electrode G1, which is formed on the first gate-insulating film 62 and located above the semiconductor layer 63, is used as read gate electrode. In this case, too the second gate electrode G2, the second gate-insulating film 65, the semiconductor layer 63, the source electrode S1, and the drain electrode D1 constitute a coplaner-type thin-film transistor. The type thin-film memory element comprises this thin-film transistor, the second gate-insulating film 65, and the first gate electrode G1 (i.e., the read gate electrode) formed on the first gate-insulating film 65 and located below the semiconductor layer 63.

The thin-film transistor is not limited to the inverted staggered type one or the coplanar-type one. Rather, it can be of the staggered type or inverted coplanar type. If this is the case, the gate electrode provided formed on the insulating film unable to accumulate electrical charge and located above or below the semiconductor layer functions as read gate electrode, whereby a type thin-film memory element can be provided which has the same advantage as the memory element described above with reference to FIGS. 6 and 7.

In the first embodiment described above, the second gate-insulating film 65, which cannot accumulate electrical charge, is of a single-layered structure. Instead, this film 65 can be a multi-layered film. A thin-film memory element according to the invention, wherein the second gate-insulating film is comprised of two or more layers, will now be described, with reference to FIGS. 12 and 13.

Figure 12:
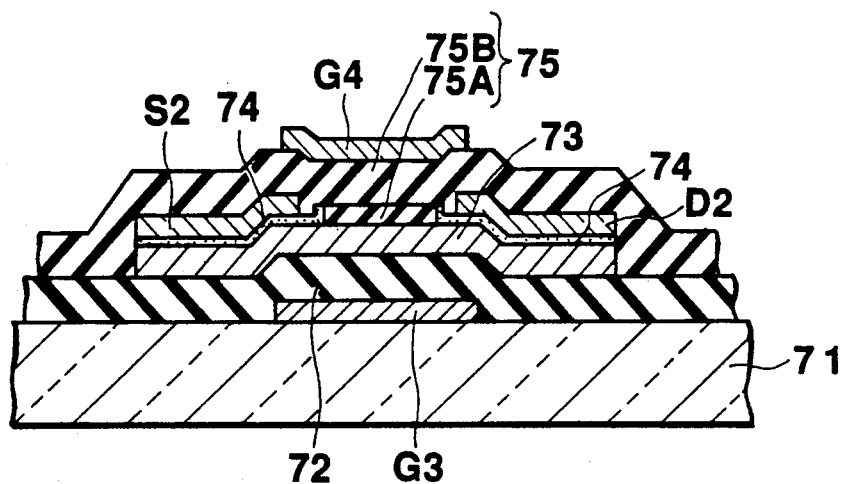
FIG. 12 and FIG. 13 are a sectional view and a plan view, respectively, showing a thin-film memory element according to a second embodiment of the present invention.
Figure 13:
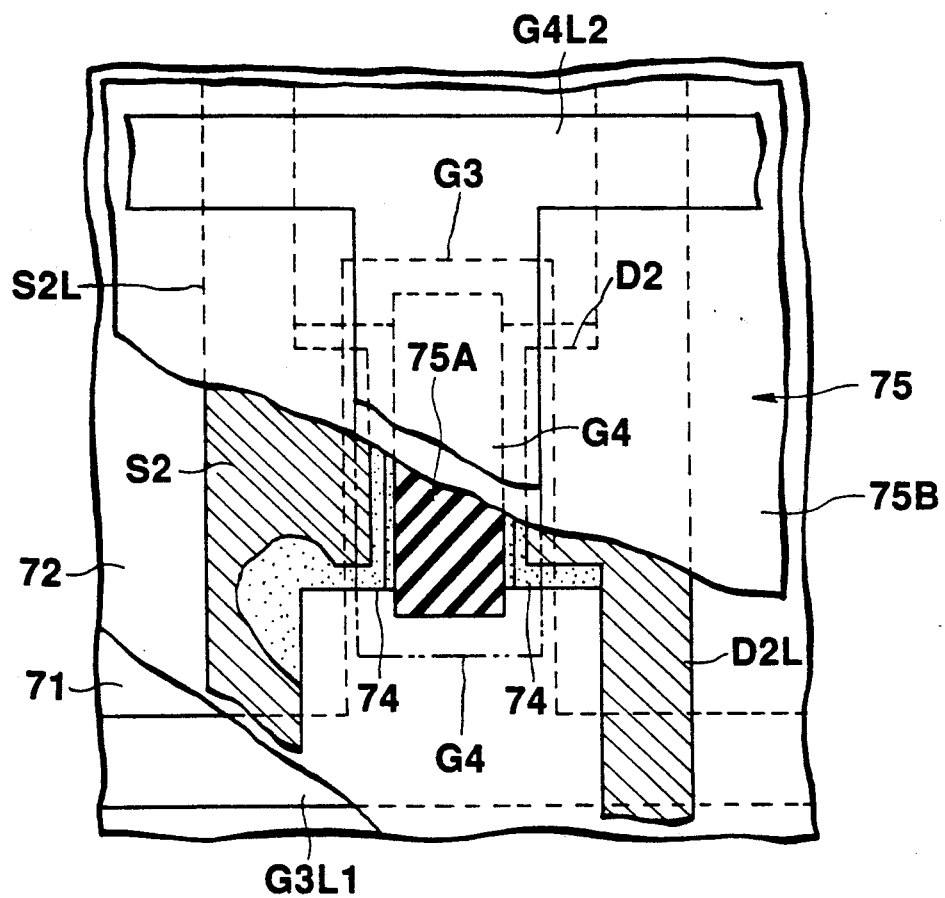

FIGS. 12 and 13 are a sectional view and a plan view of the memory element, respectively. As these figures show, this thin-film memory element comprises an insulating substrate 71 made of glass or the like. A first gate electrode G3 is formed on the substrate 71. A first gate-insulating film 72 is formed on the substantially entire upper surface of the substrate 71. thereby covering the first gate electrode G3. The gate-insulating film 72 is made of silicon nitride (SiN) whose Si/N composition ratio is 0.85 to 1.1, and which can therefore accumulate electrical charge. The film 72 has a thickness of 2,000 Å. An i-type a-Si (intrisic-type amorphous silicon) semiconductor layer 73 is formed on the first gate-insulating film 72 and located right above the first gate electrode G3. An $n^+$-type a-Si semiconductor layers 74 doped with an n-type impurity are formed on the semiconductor layer 73. A source electrode S2 and a drain electrode D2 are formed on the $n^+$-type a-Si semiconductor layers 74 and located above the i-type semiconductor layer 73. The first gate electrode G3, the first gate-insulating film 72 able to accumulate electrical charge, the i-type semiconductor layer 73, the n-type semiconductor layers 74, the source electrode S2, and the drain electrode D2 constitute a thin-film transistor of the inverted staggered type. The n-type semiconductor layers 74 are comprised of two parts located in a channel region of the i-type semiconductor layer 73 (that is, between the source electrode S2 and the drain electrode D2).

As is evident from FIGS. 12 and 13, the thin-film memory element further comprises a second gate-insulating film 75 formed on the upper surface of the structure, thus covering up the first gate-insulating film 72, the source electrode S2, and the drain electrode D2. A second gate electrode G4 is formed on the second gate-insulating film 75 and located above the i-type semiconductor layer 73. The second gate-insulating film 75 is comprised of a lower insulating film 75A formed on the i-type semiconductor layer 73 and an upper insulating film 75B formed on the first gate-insulating film 72, the source electrode S2, and the drain electrode D2. Both the upper film 75A and the lower film 75B are made of silicon nitride (SiN) whose Si/N composition ratio is equal or similar to stoichiometric ratio, and therefore cannot accumulate electrical charge. The lower insulating film 75A has a thickness of 1,000 Å, whereas the upper insulating film 75B has a thickness of 2,000 Å.

The first gate electrode G3, the source electrode S2, the drain electrode D2, and the second gate electrode G4 are connected to a first gate line GL1, a source line SL2, a drain line D2L and a second gate line GL2, respectively.

The first gate electrode G3, which is formed on the first gate-insulating film 72 able to accumulate electrical charge and is located right below the i-type semiconductor layer 73, is used as write/erase electrode. The second gate electrode G4, which is formed on the second gate-insulating film 75 not able to accumulate electrical charge and is located above the i-type semiconductor layer 73, is used as read electrode.

To sum up, the thin-film memory element shown in FIGS. 12 and 13 comprises the first gate electrode G3, the first gate-insulating film 72 capable of accumulating electrical charge, the i-type semiconductor layer 73, the n-type semiconductor layers 74, the source electrode S2, the drain electrode D2, the second gate-insulating film 75 not capable of accumulating electrical charge, and the second gate electrode G4 formed on the gate-insulating film 75 and located above the i-type semiconductor layer 73. The first gate electrode G3, first gate-insulating film 72, i-type semiconductor layer 73, n-type semiconductor layers 74, source electrode S2, and drain electrode D2 constitute a thin-film transistor. The first gate electrode G3 is used to write and erase data, whereas the second gate electrode G4 is used to read data.

With reference to FIGS. 14A to 14G, it will now be explained how the thin-film memory element shown in FIGS. 12 and 13 is manufactured.

Figure 14A:
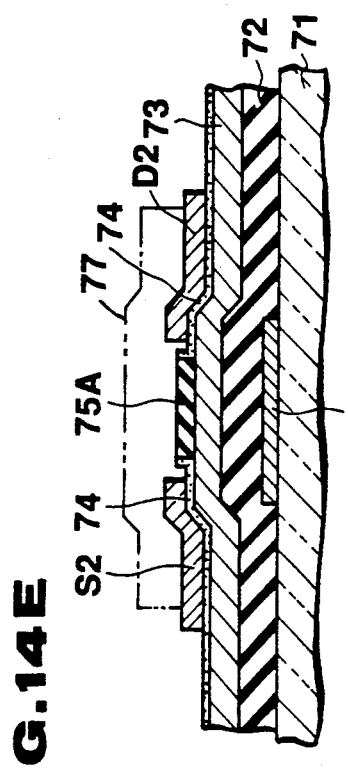
FIGS. 14A to 14G are sectional views of an unfinished product, explaining the steps of manufacturing the thin-film memory element shown in FIGS. 12 and 13.
Figure 15:
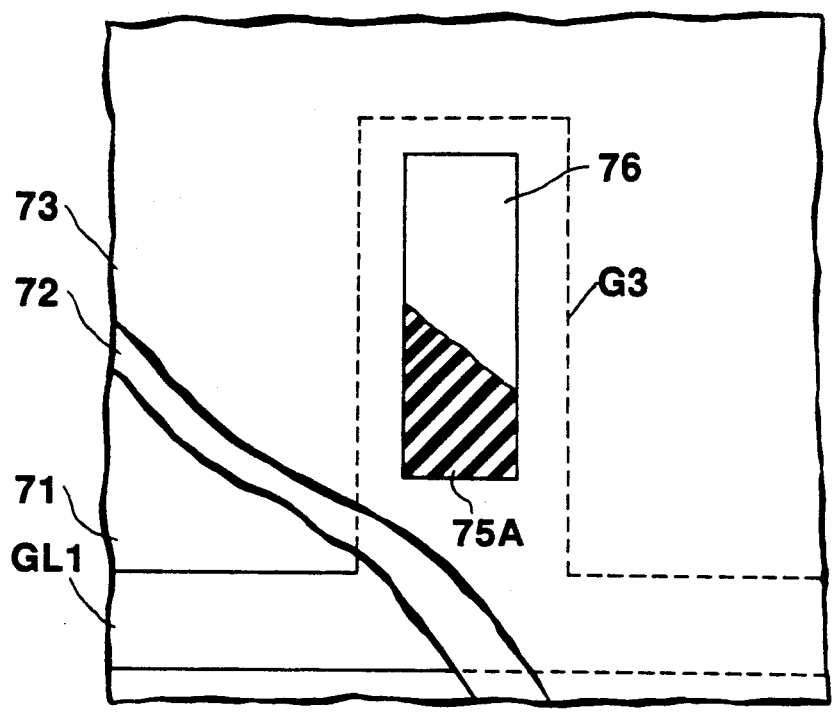
FIG. 15 is a plan view of the unfinished product at the step shown in FIG. 14B.
Figure 16:
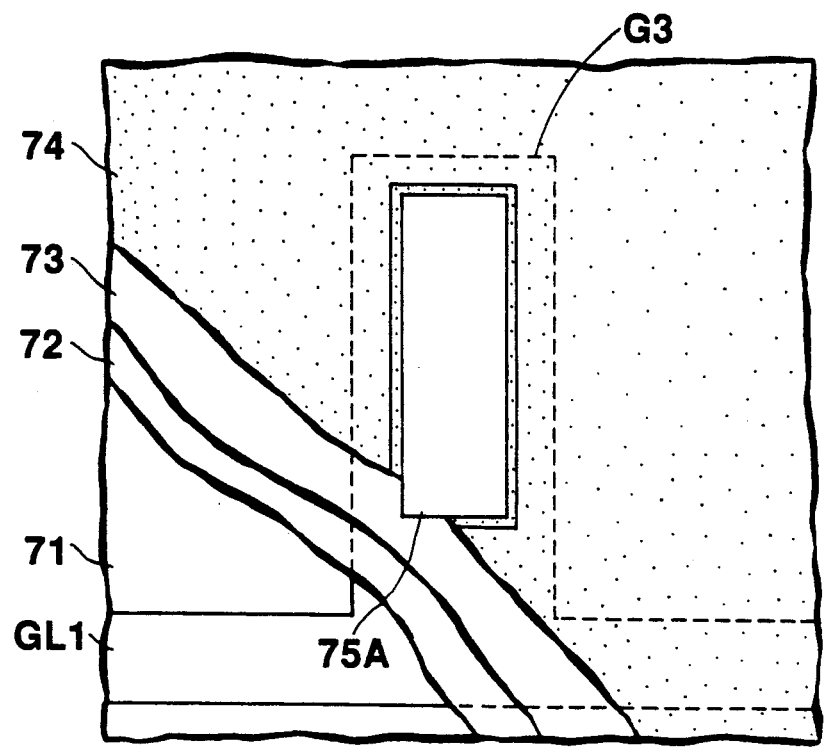
FIG. 16 is a plan view showing the unfinished product at the step shown n FIG. 14D.

First, as is shown in FIG. 14A and FIGS. 15 and 16, the first gate electrode G3 and the first gate line GL1, both having a thickness of 1,000 Å, are formed on the insulating substrate 71. To be more specific, the first gate electrode G3 is formed in two steps. First, a film of metal such as chromium is formed on the substrate 71 by means of vacuum vapor deposition or sputtering. Second, the this metal film is patterned by means of photolithography.

Then, also as is shown in FIG. 14A, the first gate-insulting film 72, e.g., a silicon nitride film capable of accumulating electrical charge, is formed on the substrate 71 and also on the first gate electrode G3, by means of plasma CVD method. Further, the i-type semiconductor layer 73, i.e., i-type a-Si layer, is deposited on the first gate-insulating film 72, also by means of plasma CVD method. Next, a lower insulating film 75A, which cannot accumulate electrical charge, is deposited on the i-type semiconductor layer 73 by means of plasma CVD method. The gate-insulating film 72, the i-type semiconductor layer 73, and the lower insulating film 75A have a thickness of 2,000 Å, a thickness of 1,500 Å, and a thickness of 1,000 Å, respectively.

Figure 14B:
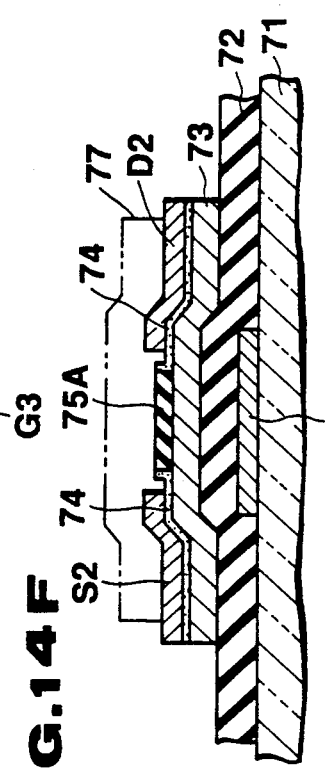

Next, as is shown in FIG. 14A, a resist mask 76, which has the same shape and size as the channel region to be formed in the i-type semiconductor layer 73, is formed on the lower insulating film 75A. Thereafter, as is illustrated in FIG. 14B, a mixture of an HF solution and an NH4 solution is applied to the lower insulating film 75A, thereby patterning the film 75A into a film having the same shape and size as the channel region.

Figure 14C:
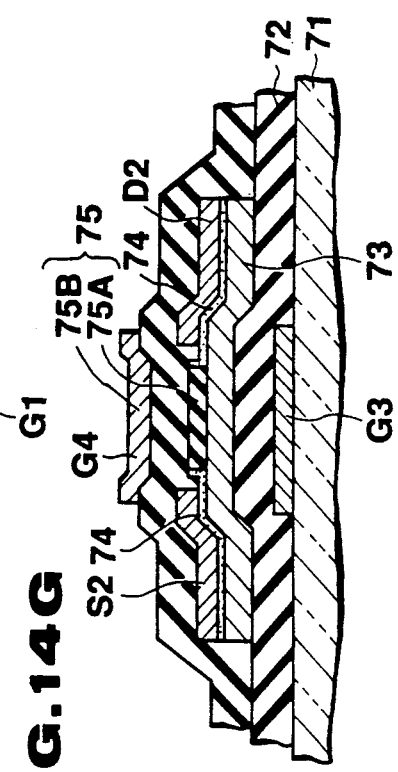

Further, as is illustrated in FIG. 14C, the n-type semiconductor layer 74, i.e., an n+-type a-Si layer, is deposited to a thickness of 500 Å on the i-type semiconductor layer 73 and also on the resist mask 76 by means of CVD method, during which the structure shown in FIG. 14A is left to stand at 100° to 150° C.

Figure 14D:
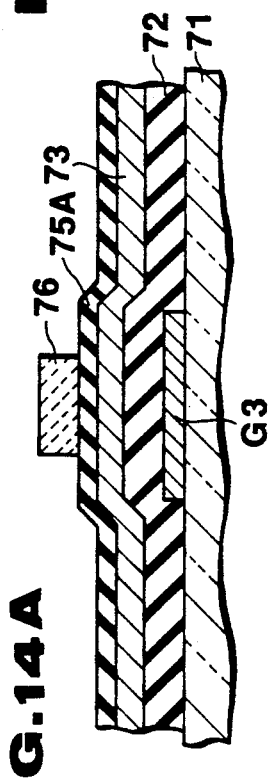

Next, the whole structure shown in FIG. 14C is immersed in a resist-removing solution (i.e., an organic alkali solution), thereby removing the resist mask 76. Then, that portion of the n-type semiconductor layer 74 which is located on the lower insulating film 75A is removed as is illustrated in FIG. 14D and also in FIG. 16.

Figure 14E:
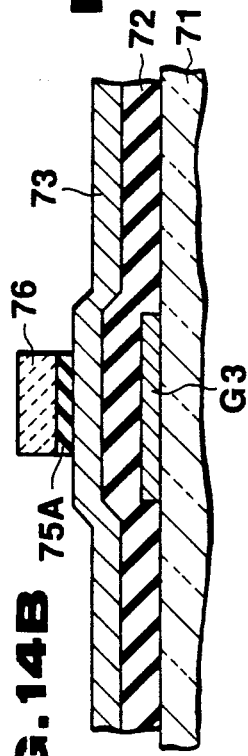
Figure 17:
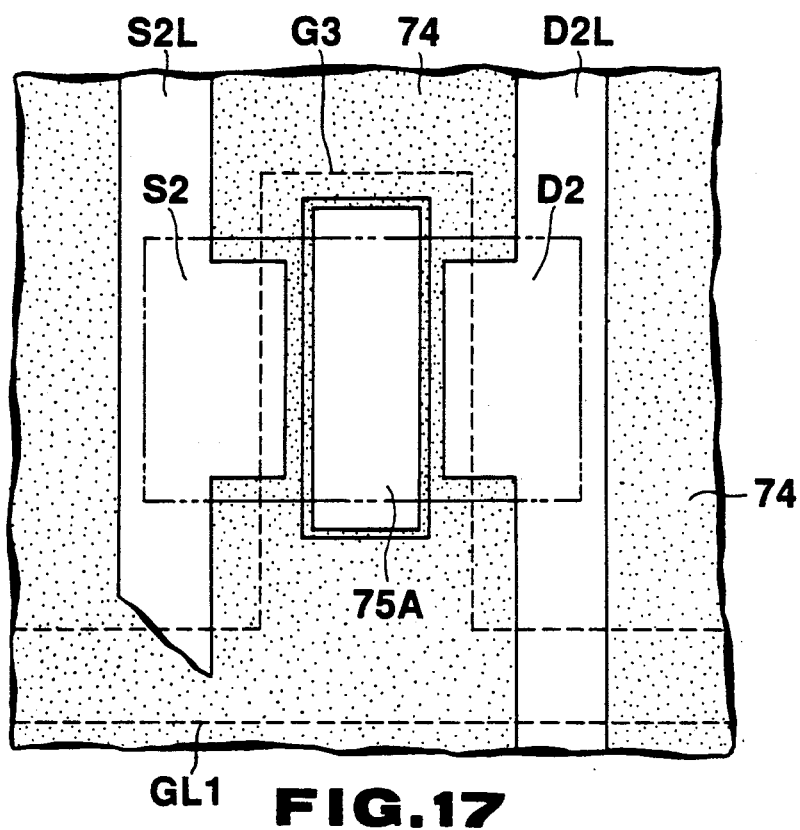
FIG. 17 is a plan view of the unfinished product at the step shown in FIG. 14E.

Then, a film of metal such as chromium (Cr) is formed on the n-type semiconductor layers 74 by means of vacuum vapor deposition or sputtering. This metal film is patterned by photolithography, thereby forming the source electrode S2, the source line S2L, the drain electrode D2, and the drain line D2L, as is illustrated in FIG. 14E and FIG. 17. The patterning of the metal film is performed by reactive ion etching, wherein used is made of a mixture gas of oxygen and chlorine-based gas such as CCl4.

Figure 14F:
Figure 18:
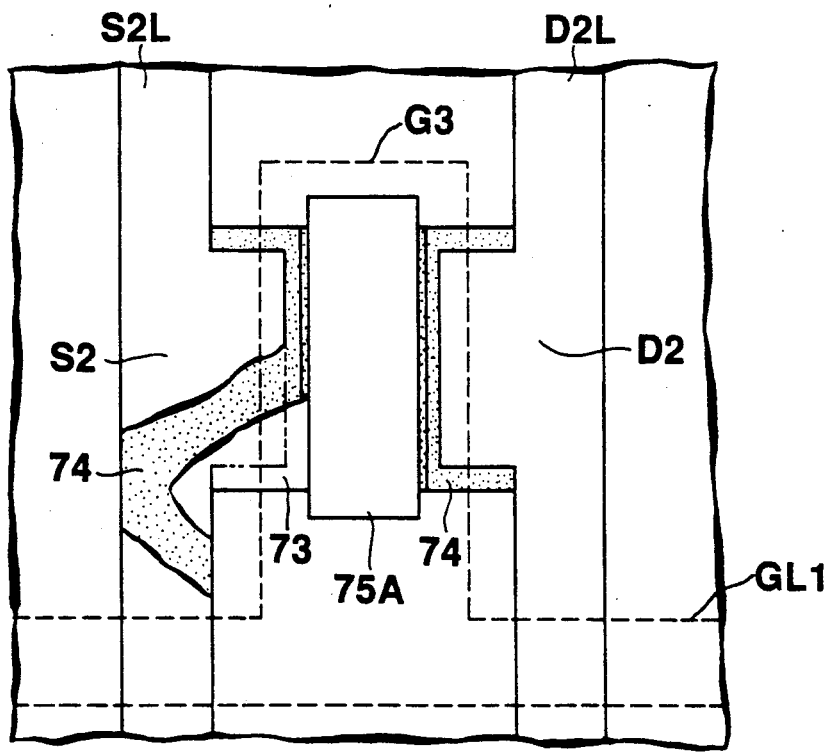
FIG. 18 is a plan view showing the unfinished product at the step shown in FIG. 14F.

Thereafter, a resist mask 77 having the same shape and size as the memory element to be manufactured is formed on the n-type semiconductor layers 74 and the lower insulating film 75A. As is shown in FIG. 14F and FIG. 18, the n-type semiconductor layers 74 and the i-type semiconductor layer 73 are patterned by using the resist mask 77, the source electrode S2 and the drain electrode D2 as etching mask, by means of RIE (Reactive Ion Etching), in which a mixture of CCl4 and He is used as etchant. Both the n-type semiconductor layers 74 and the i-type semiconductor layer 73 remain in their entirety under the source electrode S2 and the drain electrode D2.

Figure 14G:
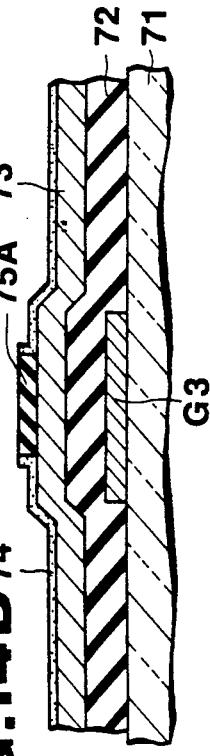

Further, the resist mask 77 is removed. As is illustrated in FIG. 14G, an upper insulating film 75B (i.e., a silicon nitride film), which has a thickness of 2,000 Å and cannot accumulate electrical charge, is deposited by means of plasma CVD on the substrate 71, the lower insulating film 75A, the source electrode S2, the drain electrode D2, the source line S2L, and the drain line D2L. The upper insulating film 75B and the lower insulating film 75A combine, forming the second gate-insulating film 75. Thereafter, a film of metal such as chromium (Cr), having thickness of 1,000 Å, is formed on the second gate-insulating film 75 (more precisely, the upper insulating film 75B) by means of vacuum vapor deposition or sputtering. This metal film is patterned by means of photolithography, thereby forming the second gate electrode G4 and the second gate line GL2. As a result, the thin-film memory element shown in FIGS. 12 and 13 is completed.

The thin-film memory element shown in FIGS. 12 and 13 operates in the same way as the memory element according to the first embodiment, and its operation will not be explained. As has been described, the thin-film memory element according to the second embodiment comprises the first gate electrode G3 (i.e., the write/erase electrode), the first gate-insulating film 72 able to accumulate electrical charge, the i-type semiconductor layer 73, the n-type semiconductor layers 74, the source electrode S2, the drain electrode D2, the second gate-insulating film 75 not able to accumulate electrical charge, and the second gate electrode G4 formed on the gate-insulating film 75 and located above the i-type semiconductor layer 73. The first gate electrode G3, first gate-insulating film 72, i-type semiconductor layer 73, n-type semiconductor layers 74, source electrode S2, and drain electrode D2 constitute a thin-film transistor. The first gate electrode G3 is used to write and erase data, whereas the second gate electrode G4 is used to read data. Therefore, neither the threshold voltage ΔVth-n nor the threshold voltage ΔVth-p of the thin-film memory element changes noticeably no matter how many times data has been read from the memory element, as can be understood from FIG. 11. Hence, data can be reliably read from this thin-film memory element for a virtually indefinitely long period of time.

The first embodiment and the second embodiment, both described above in detail, have a gate-insulating film which is able to accumulate electrical charge since it is made of SiN whose Si/N ratio ranges from 0.85 to 1.1. The gate-insulating film can accumulate electrical charge even if the SiN has an Si/N ratio of less than 0.85, or an Si/N ratio equal to stoichiometric ratio. If this is the case, however, this gate-insulating film must be as thin as about 500 Å. A thin-film memory element according to a third embodiment of the invention, which has such a gate-insulating film, will be described with more layers, will now be described, with reference to FIGS. 19 and 20.

Figure 19:
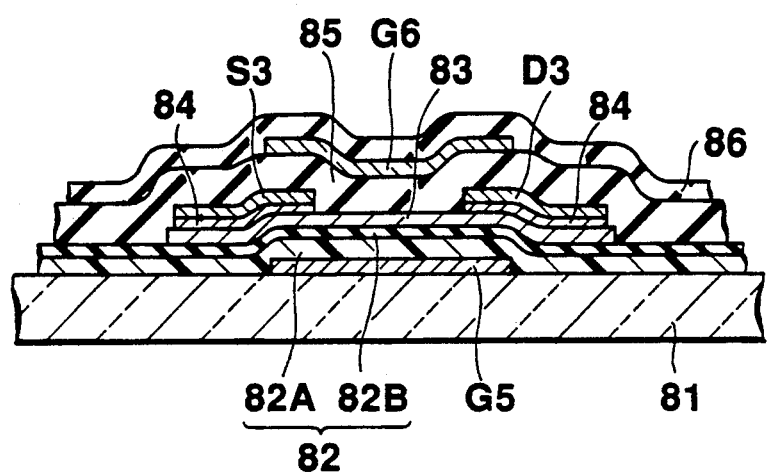
FIG. 19 and FIG. 20 are a sectional view and a plan view, respectively, showing a thin-film memory element according to a third embodiment of the present invention.
Figure 20:
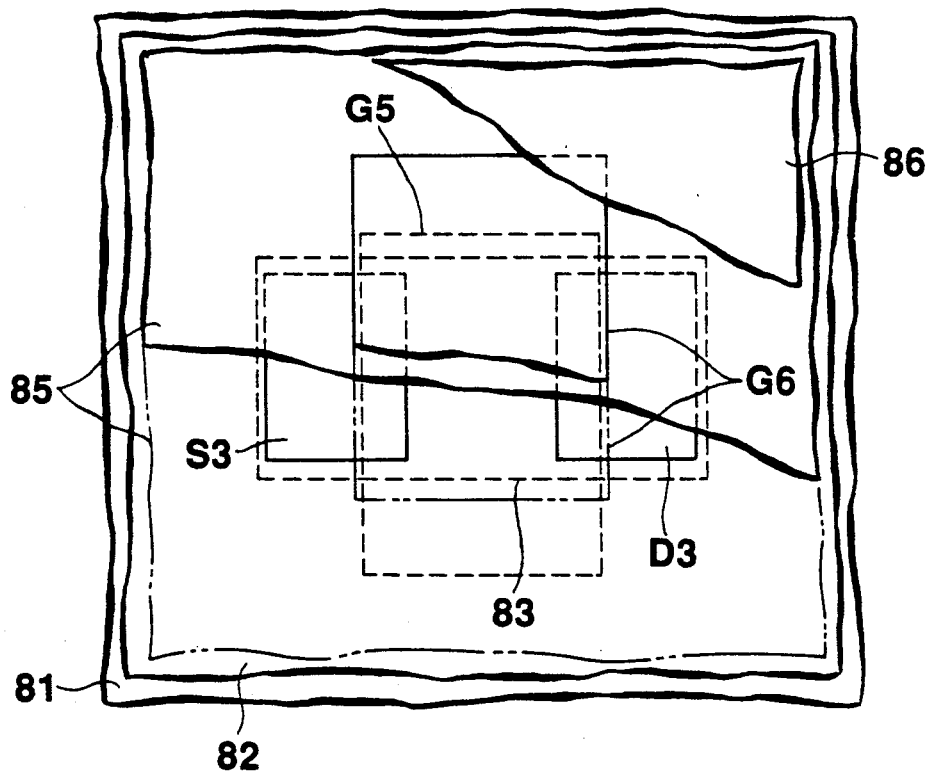

FIGS. 19 and 20 are a sectional view and a plan view of the memory element, respectively. As these figures show, this thin-film memory element comprises an insulating substrate 81 made of glass or the like. A first gate electrode G5 is formed on the substrate 81. A first gate-insulating film 82 is formed on the substantially entire upper surface of the substrate 81, thereby covering the first gate electrode G5. The gate-insulating film 82 is a two-layered film comprised of a dielectric film 82A and an insulating film 82B. The dielectric film 82A is made of tantalum oxide (TaOx) and formed on the first gate electrode G5. It has a thickness of 3,000 Å. The film 82B is formed on the dielectric film 82A and is made of silicon nitride (SiN) whose Si/N ratio is equal or similar to stoichiometric ratio. The insulating film 82B (hereinafter called "Si/N film") is thin, having a thickness of 500 Å, and can therefore accumulate electrical charge. (Since the SiN film is relatively thin, it can accumulate electrical charge, though its Si/N ratio is equal or similar to the stoichiometric ratio.) An i-type semiconductor layer 83 is formed on the first gate-insulating film 82 and located above the first gate electrode G5. This semiconductor layer 83 is made of i-type a-Si (amorphous silicon). $N^+$-type a-Si semiconductor layers 84 are formed on the semiconductor layer 83. A source electrode S3 and a drain electrode D3 are formed on the $n^+$-type a-Si semiconductor layers 84 and located above the i-type semiconductor layer 83. The first gate electrode G5, the first gate-insulating film 82, which has the SiN film 82B capable of accumulating electrical charge, the i-type semiconductor layer 83, the n-type semiconductor layers 84, the source electrode S3, and the drain electrode D3 constitute a thin-film transistor of the inverted staggered type.

As is evident from FIGS. 19 and 20, the thin-film memory element further comprises a second gate-insulating film 85 formed on the upper surface of the structure, thus covering up the i-type semiconductor layer 83, the source electrode S3, and the drain electrode D3. A second gate electrode G6 is formed on the second gate-insulating film 85 and located above the i-type semiconductor layer 83. The second gate-insulating film 85 is made of silicon nitride (SiN) whose Si/N ratio is similar to the stoichiometric ratio. It has a thickness of 3000 Å or more, and therefore cannot accumulate electrical charge. The first gate electrode G5, the source electrode S3, the drain electrode D3, and the second gate electrode G6 are connected to three leads (not shown), respectively.

The first gate electrode G5 is used as write/erase electrode, whereas the second gate electrode G6 is used as read electrode.

In summary, the thin-film memory element shown in FIGS. 19 and 20 comprises the first gate electrode G5, the first gate-insulating film 82 capable of accumulating electrical charge, the i-type semiconductor layer 83, the n-type semiconductor layers 84, the source electrode S3, the drain electrode D3, the second gate-insulating film 85 not capable of accumulating electrical charge, and the second gate electrode G6 formed on the gate-insulating film 85 and located above the i-type semiconductor layer 83. The first gate electrode G5, first gate-insulating film 82, i-type semiconductor layer 83, n-type semiconductor layers 84, source electrode S3, and drain electrode D3 constitute a thin-film transistor. The first gate electrode G5 is used to write and erase data, whereas the second gate electrode G6 is used to read data.

With reference to FIGS. 21A to 21E, it will now be explained how the thin-film memory element shown in FIGS. 19 and 20 is manufactured.

Figure 21A:
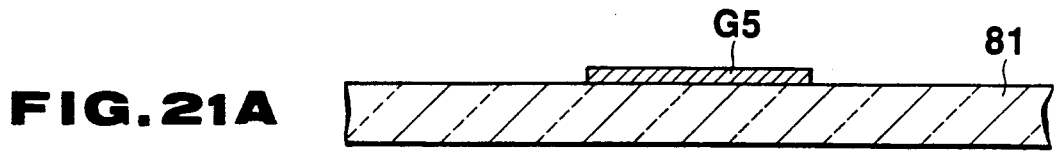
FIGS. 21A to 21E are sectional views of an unfinished product, explaining the steps of manufacturing the thin-film memory element shown in FIGS. 19 and 20.

First, as is shown in FIG. 21A, the first gate electrode G5 having a thickness of 1,000 Å is formed on the insulating substrate 81. To be more specific, the first gate electrode G5 is formed in two steps. In the first step, a film of metal such as chromium is formed on the substrate 81 by means of vacuum vapor deposition or sputtering. In the second step, the this metal film is patterned by photolithography.

Figure 21B:
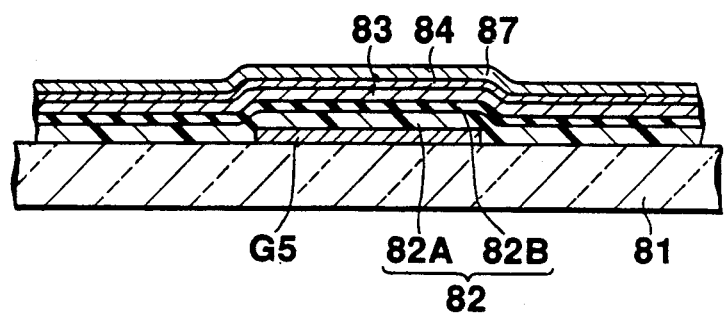

Next, as is shown in FIG. 21B, a dielectric film 82A is formed on the substrate 81 and also on the first gate electrode G5. Then, an SiN film 82B is formed on the dielectric film 82A. Further, the i-type semiconductor layer 83 is formed on the SiN film 82B, and the n-type semiconductor layer 84 is formed upon the i-type semiconductor layer 83. Next, as is shown also in FIG. 21B, a metal film 87, which will be processed to from the source electrode S3 and the drain electrode D3, is formed on the n-type semiconductor layer 84.

The dielectric film 82A is formed by means of reactive sputtering. More precisely, a film of tantalum oxide (TaOx) is deposited to a thickness of 3,000 Å by using a sputtering apparatus wherein a target made of tantalum (Ta) is located, and an argon (Ar) atmosphere containing 25% of oxygen ($O_2$) used as sputtering gas. The SiN film 82B is formed by means of plasma CVD method, wherein $SiH_4$, $NH_3$, and $N_2$ are applied in such flow rates that SiN whose Si/N ratio is nearly equal to 0.75 is deposited to a thickness of 500 Å. The i-type semiconductor layer 83 and the n-type semiconductor layer 84 are sequentially formed by means of plasma CVD method. The i-type semiconductor layer 83 is deposited to a thickness of 1,500 Å, by using SiH$_4$ and H$_2$. The n-type semiconductor layer 84 is deposited to a thickness of 250 Å, by using SiH$_4$, H$_2$, and PH$_3$. The metal film 87, which will be processed to form the source electrode S3 and the drain electrode D3, is formed by depositing metal such as chromium (Cr) to a thickness of 1,000 Å, by means of vacuum vapor deposition or sputtering.

Figure 21C:
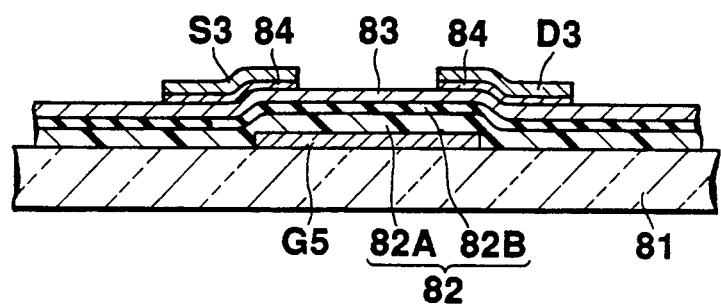

Then, as is shown in FIG. 21C, the metal film 87 is patterned by photolithography, thereby forming the source electrode S3 and the drain electrode D3. Further, the n-type semiconductor layer 84, located below the metal film 87, is patterned. By this patterning, the n-type semiconductor layer 84 is divided into two parts which have the same shape and size as the source and drain electrodes S3 and D3. The patterning of the metal (Cr) film 87 is achieved by reactive ion etching, in which a mixture of CCl$_5$ and O$_2$ is used as etching gas. The patterning of the n-type semiconductor layer 84 (i.e., n+-type a-Si layer) is carried out by reactive ion etching, wherein used is made of a mixture gas of CF$_4$ and O$_2$.

Figure 21D:
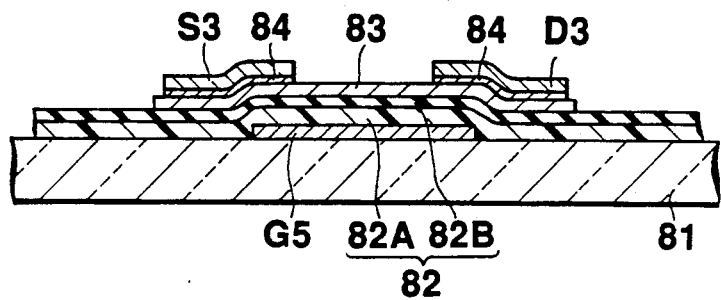

Next, as is shown in FIG. 21D, the i-type semiconductor layer 83 is patterned by photolithography, thus having the same shape and size as the thin-film memory element to be manufactured. The patterning of the i-type semiconductor layer 83 is performed by reactive ion etching, wherein use is made of a mixture of CCl$_5$ and He as etching gas.

Figure 21E:
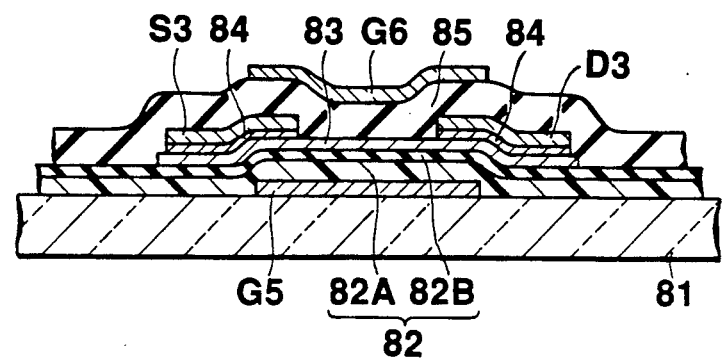

Thereafter, the structure shown in FIG. 21D is immersed in a 1%-HF solution for about 15 seconds, whereby the surface of this structure is cleaned. The upper surface of the structure is then etched slightly, washed with pure water, and is dried. Immediately, the second gate-insulating film 85 is formed on the i-type semiconductor layer 83, the source electrode S3, and the drain electrode D3, as is illustrated in FIG. 21E. More specifically, this film 85 made of SiN is formed by plasma CVD method, wherein SiH$_4$, NH$_3$, and N$_2$ are applied in such flow rates that SiN is deposited to the thickness of 3,000 Å and the Si/N ratio of the resultant SiN film is nearly equal to 0.75.

Further, a film of metal such as chromium (Cr) is formed on the second gate-insulating film 85 by means of vacuum vapor deposition or sputtering. This metal film is patterned by photolithography, thereby forming the second gate electrode G6, as is illustrated in FIG. 21E.

Thereafter, a protective insulating film (not shown) made of silicon nitride (Si/N=0.75) and being 2,000 Å thick is formed on the upper surface of the structure shown in FIG. 21E. As a result, the thin-film memory element shown in FIGS. 19 and 20 is manufactured.

The thin-film memory element shown in FIGS. 19 and 20 operates in the same way as the memory elements according to the first and second embodiments, and its operation will not be explained. As has been described, both the SiN film 82B, i.e., part of the first gate-insulating film 82, and the second gate-insulating film 85 are made of SiN whose Si/N ratio is nearly equal to stoichiometric ratio, and are sufficiently thin, the thin-film memory element shown in FIGS. 19 and 20 attains the same advantage as the memory elements according to the first and second embodiments. Therefore, data can be reliably read from this thin-film memory element for a virtually indefinitely long period of time.

When the characteristic of the interface between the semiconductor layer and the second gate-insulating film is poor, the thin-film memory element will, in some cases, fail to operate reliably The interfacial characteristic is possibly degraded if the source electrode and the drain electrode are formed after the semiconductor layer has been formed. This is because both electrodes are made by patterning a metal film by means of photolithography, and the surface of the semiconductor layer is stained during the patterning of the metal film. Once the surface of the semiconductor layer is stained, the characteristic of the interface between the layer and the gate-insulating film is deteriorated to such an extent that data can no longer be reliably written into, erased from, or written into, the thin-film memory element. It is therefore desirable that this interfacial characteristic be improved.

According to the present invention, there is provided a thin-film memory element, in which the semiconductor layer and the gate-insulating film have a good interfacial characteristic. The method of manufacturing thin-film memory element, which is a fourth embodiment of the invention, will now be explained with reference to FIGS. 22A to 22E.

Figure 22A:
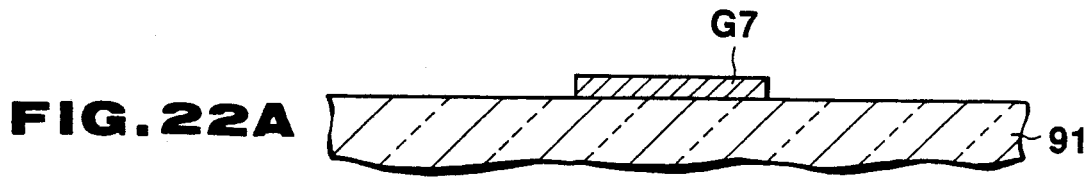
FIGS. 22A to 22E are sectional views of an unfinished product, explaining the steps of manufacturing a thin-film memory element according to a fourth embodiment of the invention.
Figure 23:
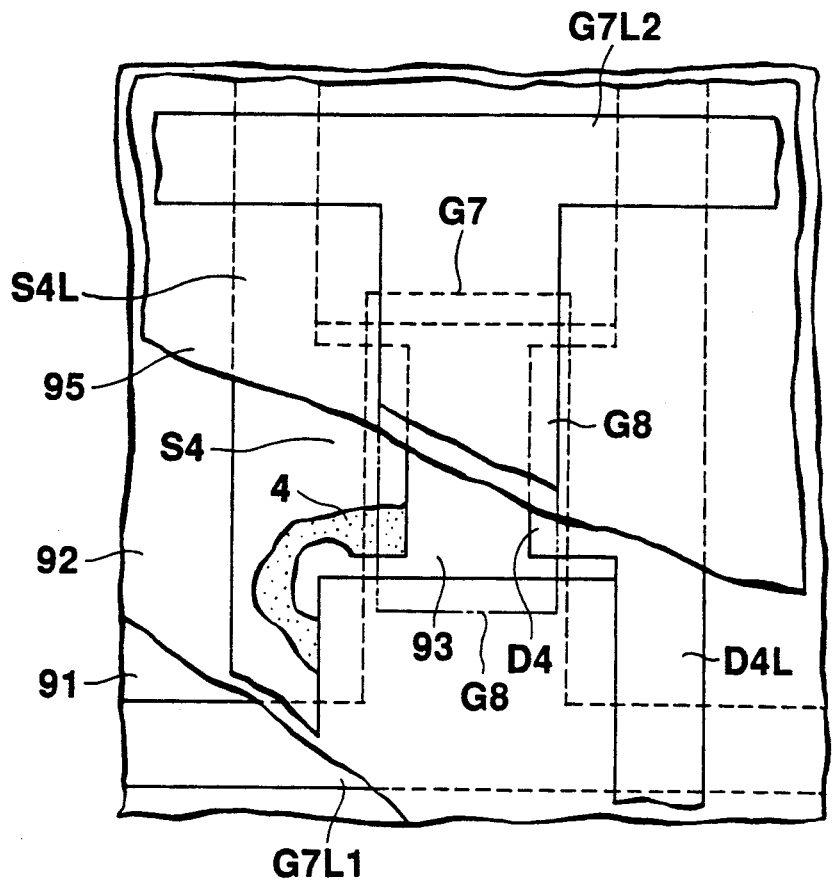
FIG. 23 is a plan view illustrating a thin-film memory element according to the fourth embodiment of the invention.

First, as is shown in FIG. 22A and FIG. 23, a first gate electrode G7 and e first gate line G7L2 are formed on an insulating substrate 91 made of glass or the like. Both the gate electrode G7 and the gate line G7L2 are 1,000 Å thick. The first gate electrode G7 and the first gate line G7L2 are formed in two steps. In the first step, a film of metal such as chromium is formed on the substrate 91 by means of vacuum vapor deposition or sputtering. In the second step, the this metal film is patterned by photolithography.

Figure 22B:
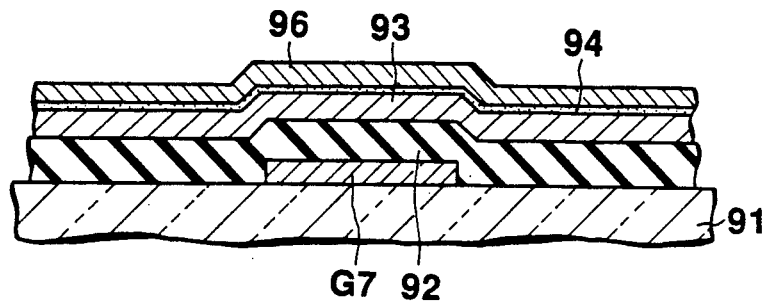

Next, as is illustrated in FIG. 22B, a first gate-insulating film 92 made of silicon nitride and able to accumulate electrical charge is formed on the upper surface of the substrate 91 and also on the first gate electrode G7. Then, an i-type semiconductor layer 93 made of i-type a-Si is formed on the first gate-insulating film 92 by plasma CVD method. Further, an n-type semiconductor layer 94 made of n+-type a-Si is formed on the i-type semiconductor layer 93, also by means of plasma CVD method. Then, a film 96 made of metal such as chromium (Cr) is formed on the n-type semiconductor layer 94 by vacuum vapor deposition or sputtering. The metal film 96 will be processed into a source electrode and a drain electrode, as will be described later. The first gate-insulating film 92, the i-type semiconductor layer 93, the n-type semiconductor layer 94, and the metal film 96 have thicknesses of 2,000 Å, 1,500 Å, 250 Å, and 500 Å, respectively.

Figure 22C:
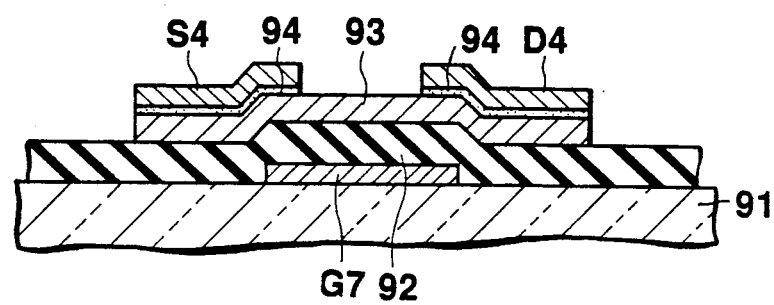

Then, the metal film 96 is patterned by photolithography, thereby forming a source electrode S4, a drain electrode D4, a source line S4L, and a drain line D4L, as is illustrated in FIG. 22C and FIG. 23. The n-type semiconductor layer 94 is patterned by photolithography, forming two semiconductor layers. The first layer has the same shape and size as the source electrode S4, whereas the second layer has the same shape and size as the drain electrode D4. The two semiconductor layers 94 thus formed are set apart from each other, thus defining a gap between them. Though this gap, the channel region of the i-type semiconductor layer 93 is exposed. Further, the i-type semiconductor layer 93 is patterned by photolithography, thus having the same shape and size as a thin-film memory transistor. The patterning of the metal film 96, the n-type semiconductor layers 94, and the i-type semiconductor layer 93 is achieved by reactive ion etching (RIE). The metal film 96 is patterned, by using a chlorine-based etching gas such as a mixture gas of CCl$_4$ and He) is used. The n-type semiconductor layers 94 are patterned, by using a fluoride-based etching gas such as CF$_4$+10%O$_2$ gas. The i-type semiconductor layer 93 is patterned, by applying a chlorine-based etching gas such as a mixture gas of CCl$_5$ and O$_2$.

Figure 22D:
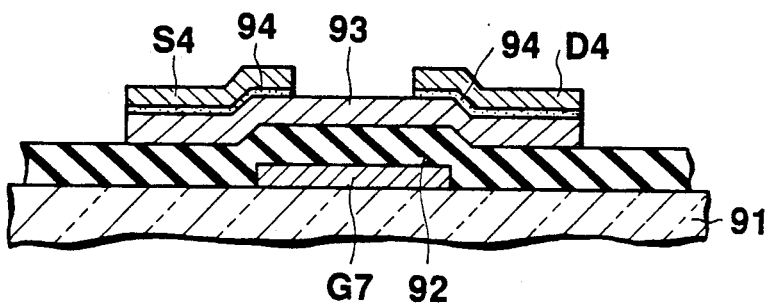

Further, as is illustrated in FIG. 22D, the surface of the i-type semiconductor layer 93 is washed. This washing is performed by immersing the whole structure shown in FIG. 22D in either an aqueous solution of hydrogen fluoride (i.e., 1 wt % HF) or an aqueous solution of ammonium fluoride (i.e., 40 wt % NH$_4$F), for about 15 seconds, then washing this structure with pure water, and finally drying the structure.

Figure 22E:
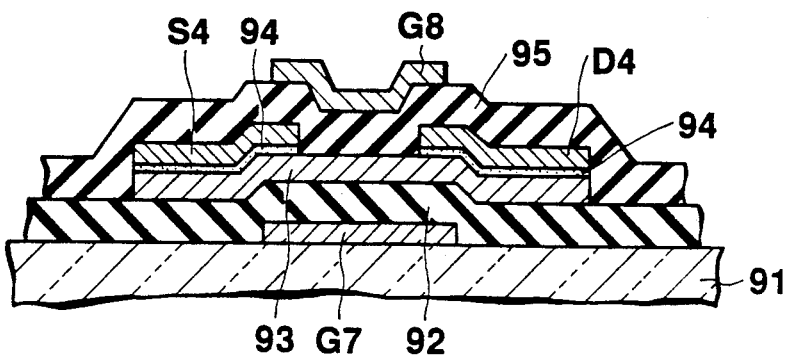

Thereafter, as is illustrated in FIG. 22E, a second gate-insulating film 95 is formed, by means of plasma CVD method, on the first gate-insulating film 92, the i-type semiconductor layer 93, the source electrode S4, and the drain electrode D4. The second gate-insulating film 95 has a thickness of 3,000 Å and is made of silicon nitride not capable of accumulating electrical charge.

The method of manufacturing a memory element, which has been explained with reference to FIGS. 22A to 22E, is characterized in that the surface of the i-type semiconductor layer 93 is washed with an aqueous solution of hydrogen fluoride immediately before the second gate-insulating film 95 is formed after the first gate electrode G7, the first gate-insulating film 92, the i-type semiconductor layer 93, the n-type semiconductor layers 94, the source electrode S4, and the drain electrode D4 have been formed. Thus, even if the upper surface of the i-type semiconductor layer 93 is stained during the process of forming the source electrode S4 and the drain electrode D4, it is cleaned by the washing. Hence, the second gate-insulating film 95 can be formed, having a good interface characteristic with respect to the i-type semiconductor layer 93. As a result, the interface between the i-type semiconductor layer 93 and the second gate-insulating film 95 has good characteristic. Data can therefore be reliably read from the thin-film memory element manufactured by this method.

The method described above is designed to manufacture a thin-film memory element in which the first gate electrode G7 and the second gate electrode G8 are used as write/erase electrode and read electrode, respectively. Nevertheless, the method can be applied to the manufacture of a thin-film memory element in which the gate electrodes G7 and G8 are used as read electrode and write/erase electrode, respectively. If this is the case, it suffices to fulfill two requirements only. First, the first gate-insulating film 92 must made of silicon nitride which cannot accumulate electrical charge, whereas the second gate-insulating film 95 is made of silicon nitride which can accumulate electrical charge. Second, the surface of the i-type semiconductor layer 93 must be washed with an aqueous solution of hydrogen fluoride.

Any embodiment of the invention, that has been described above, is a thin-film memory element whose threshold voltage remains unchanged, no matter how many times data has been read from it. Therefore, data can be reliably read from the memory element, virtually for an indefinitely long period of time.

It will now explained the method of driving the thin-film memory elements according to the embodiments described above.

Figure 24:
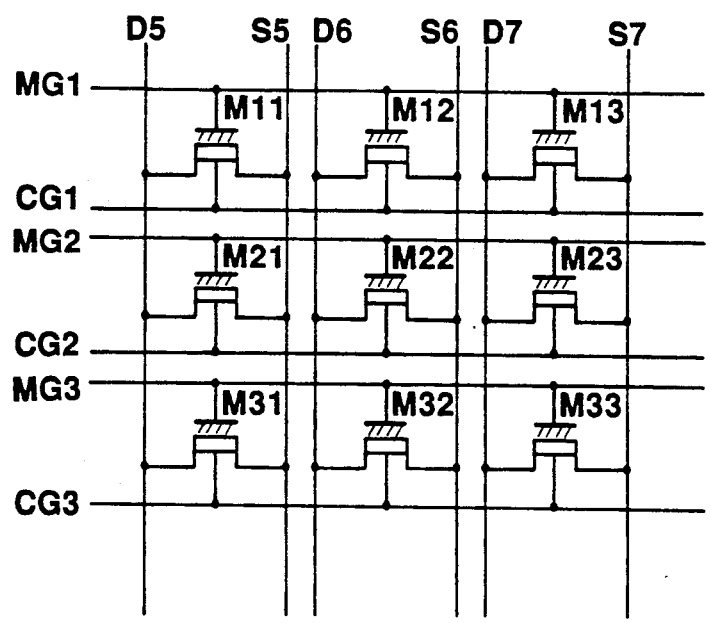
FIG. 24 is a general circuit diagram illustrating a memory comprising thin-film memory elements according to a fifth embodiment of the invention, which are arranged in rows and columns.

FIG. 24 is a circuit diagram showing a memory device comprising nine thin-film memory elements M11, M12, ..., M33 which are identical to any embodiment described above and are arranged in three rows and three columns. The memory device further comprises three memory-gate lines MG1 to MG3, and three control-gate lines CG1 to CG3—all extending parallel to the rows of the memory elements M11, M12, ..., M33. The memory device also has three drain lines D5 to D7, and three source lines S5 to S7—all extending parallel to the columns of the memory elements M11, M12, ..., M33. The memory-gate electrodes of the memory elements M11, M12, and M13 of the first row are connected to the first memory-gate line MG1; those of the memory elements M21, M22, and M23 of the second row are coupled to the second memory-gate line MG2; those of the memory elements M31, M32, and M33 of the third row are connected to the third memory-gate line MG3. The control-gate electrodes of the memory elements M11, M12, and M13 of the first row are connected to the first control-gate line CG1; those of the memory elements M21, M22, and M23 of the second row are connected to the second control-gate line CG2; those of the memory elements M31, M32, and M33 of the third row are connected to the third control-gate line CG3. The drain electrodes of the memory elements M11, M21, and M31 of the first column are connected to the first drain line D5; those of the memory elements M12, M22, and M32 of the second column are connected to the second drain line D6; those of the memory elements M13, M23, and M33 of the third column are connected to the third drain line D7. The source electrodes of the memory elements M11, M21, and M31 of the first column are connected to the first source line S5; those of the memory elements M12, M22, and M32 of the second column are connected to the second source line S6; those of the memory elements M13, M23, and M33 of the third column are connected to the third source line S7.

Figure 25:
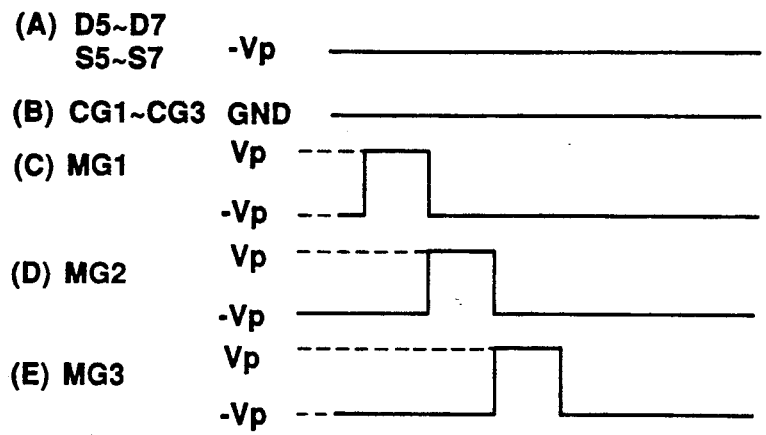
FIG. 25 shows timing charts explaining when various voltages are applied to the lines of the memory shown in FIG. 24, thereby to erase data from the memory.

FIG. 25 shows timing charts explaining when various voltages are applied to the memory-gate lines MG1 to MG3, thereby to erase data from the memory elements of the three rows which are coupled to these memory-gate lines MG1 to MG3, respectively. To erase data from the memory elements, the control-gate lines CG1 to CG3 are held at a predetermined DC level, e.g., the GND (ground) level as is illustrated in FIG. 25B, and a voltage of 2 Vp, for example, is applied between the memory-gate lines MG1 to MG3 and the drain lines D5 to D7, on the one hand, and the source lines S5 to S7, on the other, hand. In this embodiment, and a voltage positive with respect to the GND level is applied to the memory-gate lines, and a voltage negative with respect to the GND level is applied the source lines and drain lines as is shown in FIG. 25A, so that a voltage of 2 Vp is applied between any memory-gate line, on the one hand, and any source line and any drain line, on the other hand. To be precise, a voltage of Vp is applied to the memory-gate line MG1 to MG3, whereas a voltage of −Vp is applied to all source lines S5 to S7 and all drain lines D5 to D7.

More specifically, as is illustrated in FIG. 25, pulse signals, each rising from −Vp to +Vp and then falling from +Vp to −Vp, are sequentially supplied to the memory-gate lines MG1 to MG3. As a result, a voltage of 2 Vp is applied between each memory-gate line, on the one hand, and any source line and any drain line, on the other, whereby data is read from the row of the memory elements connected to the memory-gate line, the source lines, and the drain lines. Since a voltage of −Vp, the same voltage as applied to the source and drain lines, is applied to the unselected memory-gate lines, data is not erased from the memory elements M connected to the unselected memory-gate lines.

Figure 26:
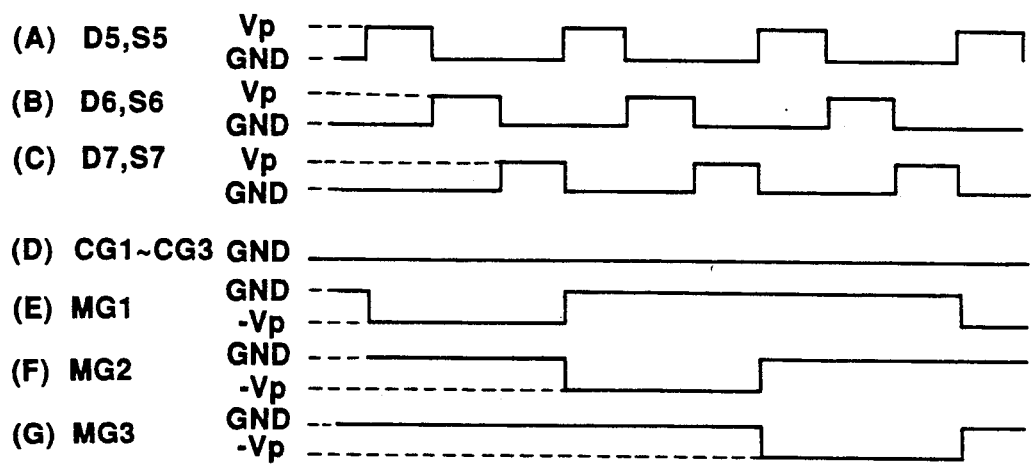
FIG. 26 shows timing charts explaining when various voltages are applied to the lines of the memory shown in FIG. 24, thereby to write data from the memory.

FIG. 26 shows timing charts explaining when various voltages are applied to the lines, in order to write data into the memory device shown in FIG. 24 in units of one bit. As can be understood from FIG. 26D, the control-gate lines CG1 to CG3 are held at a predetermined DC level, e.g., the GND (ground) level as is illustrated in FIG. 25B. Further, a voltage of −2 Vp, for example, is applied between the memory-gate lines MG1 to MG3 and the drain lines D5 to D7, on the one hand, and the source lines S5 to S7, on the other, hand. Precisely, a voltage negative with respect to the GND level is applied to the memory-gate lines as is shown in FIGS. 26E, 26F, and 26G, and a voltage positive with respect to the GND level is applied the source lines and drain lines as is shown in FIGS. 26A, 26B, and 26C. More specifically, a voltage of −Vp is applied to the memory-gate line MG1 to MG3, whereas a voltage of +Vp is applied to all source lines S5 to S7 and all drain lines D5 to D7. In other words as is illustrated in FIGS. 25D to 25G. pulse signals, each rising from −Vp to the GND level and then falling from the GND level to −Vp, are sequentially supplied to the memory-gate lines MG1 to MG3, and as is shown in FIGS. 26A to 26C, pulse signals, each rising from the GND level to the +Vp and then falling from +Vp to the GND level are sequentially supplied to the source lines S1 to S3 and the drain lines D1 to D3 as is illustrated in FIGS. 26A to 26C. While the pulse signals are being supplied to the memory-gate lines MG1 to MG3 and the source lines S1 to S3 and the drain lines D1 to D3, the control-gate lines CG1 to CG3 are held at the GND level.

As a result of this, a voltage of −2 Vp is applied between each memory-gate line, on the one hand, and any source line and any drain line, on the other, whereby data is read from the memory element connected to this memory-gate line, the source line, and the drain line. Assuming that the memory-gate line MG1 has been selected. When a write voltage of +Vp is applied to the source line S5 and the drain line S5 in this condition, a voltage of −2 Vp is applied between memory-gate line MG1, on the one hand, and the source line S5 and the drain line D5, on the other hand. At this time, the other source lines S6 and S7 and the other drain lines D6 and D7 are held at the GND level. Hence, a voltage of −Vp is applied to the gates of the memory elements M12 and M13, and data is written into neither the memory element M12 nor memory element M13.

Further, in this condition, the memory elements M22, M23, M32, and M33 remain unselected since the source lines S6 and S7, the drain lines D6 and D7, and the memory-gate lines MG2 and MG3 are all held at the GND level.

Since the various voltages are applied to the control-gate lines, the memory-gate lines, the source lines, and the drain lines, in the specific manner illustrated in FIGS. 26A to 26E, one-bit data can be written into any selected memory element, not adversely influencing the data stored in the unselected memory elements.

Figure 27:
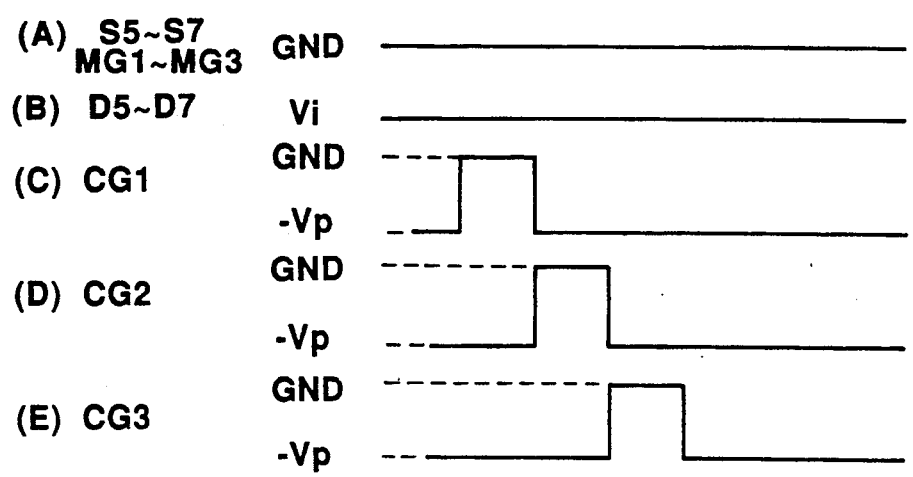
FIGS. 27 shows timing charts explaining when various voltages are applied to the lines of the memory shown in FIG. 24, thereby to read data from the memory.

FIG. 27 shows timing charts explaining when various voltages are applied to the memory-gate lines MG1 to MG3 and the control-gate lines CG1 to CG3, in order to read data out of the memory elements of a row which are connected to a selected control-gate line CG1, CG2, or CG3. To read data from any row of memory elements, all source lines S5 to S7 all memory-gate lines MG1 to MG3 are held at the GND level as is shown in FIG. 27A. Further, all drain lines D5 to D7 are set at a read voltage Vi, as is illustrated in FIG. 27B. Also, pulse signals, e.g., pulse voltage each rising from −Vp to the GND level and then falling from the GND level to −Vp, are supplied to the control-gate lines CG1 to CG3 at different times, as is shown in FIGS. 27C, 27D, and 27E. As a result, the data items stored in the memory elements M11, M12 and M13 connected to the control-gate line CG1 are first read out through drain lines D5 to D7, respectively; then, the data items stored in the memory elements M21, M22 and M23 coupled to the control-gate line CG2 are read out through the drain lines D5 to D7, respectively; finally, the data items stored in the memory elements M21, M22 and M23 connected to the control-gate line CG3 are read out via the drain lines D5 to D7, respectively.

In order to write new data into the memory device described above, the data already stored in all memory elements are erased first.

Various voltages are applied to the gates electrodes, drain electrode and source electrode of thin-film memory element according to any embodiment described above, such that the element exhibits the $I_D$-$V_G'$ characteristic of an enhancement-type transistor to erase the data stored in it, or exhibits the $I_D$-$V_G'$ characteristic of a depletion-type transistor to store data in it. Nevertheless, various voltages of polarities opposite to those shown in FIGS. 25A to 25E, FIGS. 26A to 26G, and FIGS. 27A to 27E can be applied to the electrodes of the thin-film memory element, such that the element exhibits the $I_D$-$V_G'$ characteristic of a depletion-type transistor to store data in it, or exhibits the $I_D$-$V_G'$ characteristic of an enhancement-type transistor to erase data stored in it.

Moreover, in the memory device shown in FIG. 24, data items are simultaneously erased from all memory elements, or sequentially from the rows of memory elements coupled to the memory-gate lines, whereas data is written into the memory device, bit by bit. Instead, data items are sequentially erased from the memory elements, in units of one bit, whereas data items are written into all memory elements simultaneously, or sequentially into the rows of memory elements coupled to memory-gate lines.

Furthermore, since the data-erasing and the data-writing are interchangeable, the terms used in the above description, referring to data-writing can be replaced by the terms referring to data-erasing, and vice versa.

As has been described, the present invention can provide a thin-film memory element whose threshold voltage does not noticeably change no matter how many times data is read from it, and which can therefore reliably operate to read data for a virtually indefinitely long time of period.

What is claimed is:

1. A thin-film memory element into which data is electrically written and from which data is electrically read and erased, comprising:

a semiconductor layer having first and second major surfaces;

a source electrode and a drain electrode both electrically connected to said semiconductor layer;

a silicon nitride film, formed on the first major surface of the semiconductor layer, being capable of accumulating an electrical charge, and having an Si/N ratio of 0.85 to 1:1;

an insulating film, formed on the second major surface of the semiconductor layer, and having at least one of a composition ratio different from that of said silicon nitride film and a thickness different from that of said silicon nitride film;

a first gate electrode formed on the silicon nitride film; and a second gate electrode formed on the insulating film.

2. The thin-film memory element according to claim 1, wherein said insulating film is made of silicon nitride, and a voltage which is applied to said second gate electrode enables substantially no electrical charge accumulation in said insulating film.

3. The thin-film memory element according to claim 2, wherein said insulating film comprises a two-layered silicon nitride film.

4. The thin-film memory element according to claim 1, wherein said first gate electrode is used to write data into and erase data from the memory element, and said second gate electrode is used to read data from the memory element.

5. The thin-film memory element according to claim 1, further comprising supporting means for supporting the memory element.

6. The thin-film memory element having electrically writing, erasing and reading-out functions, comprising:

a semiconductor layer having first and second surfaces;

a source electrode and a drain electrode both electrically connected to said semiconductor layer;

a first insulating film means formed on said first surface of said semiconductor layer for trapping charges, and including a silicon nitride film having a composition ratio of Si/N of 0.85 to 1:1;

a second insulating film formed on said second surface of said semiconductor layer;

a first gate electrode formed on said first insulating film means; and a second gate electrode formed on said second insulating film.

7. The thin film memory element according to claim 6, wherein said second insulating film is made of silicon nitride having a composition ratio of Si/N of less than 0.85.

* * * * *